United States Patent
Yoshizawa et al.

(10) Patent No.: US 12,047,684 B2
(45) Date of Patent: Jul. 23, 2024

(54) IMAGE EXPOSURE DEVICE, IMAGE EXPOSURE METHOD, AND PROGRAM

(71) Applicant: FUJIFILM Corporation, Tokyo (JP)

(72) Inventors: Hirotoshi Yoshizawa, Kanagawa (JP); Shinichiro Sonoda, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 7 days.

(21) Appl. No.: 17/878,848

(22) Filed: Aug. 1, 2022

(65) Prior Publication Data
US 2022/0368821 A1    Nov. 17, 2022

Related U.S. Application Data

(63) Continuation of application No. PCT/JP2021/003758, filed on Feb. 2, 2021.

(30) Foreign Application Priority Data

Feb. 18, 2020   (JP) .................. 2020-025671

(51) Int. Cl.
H04N 23/73     (2023.01)
H04N 23/81     (2023.01)
H04N 25/58     (2023.01)

(52) U.S. Cl.
CPC ............ H04N 23/73 (2023.01); H04N 23/81 (2023.01); H04N 25/58 (2023.01)

(58) Field of Classification Search
CPC ........ H04N 23/73; H04N 23/81; H04N 25/58; H04N 23/10; H04N 23/60; G03B 27/725; G03B 27/16; H01L 25/167
See application file for complete search history.

(56) References Cited

U.S. PATENT DOCUMENTS

| 6,034,710 | A | 3/2000 | Kawabe et al. | |
| 6,812,966 | B1 | 11/2004 | Nakazawa | |
| 8,553,195 | B2 | 10/2013 | Nakagawa | |
| 10,522,095 | B2 * | 12/2019 | Yata | G09G 3/3208 |
| 11,228,720 | B2 * | 1/2022 | Zhang | H04N 23/741 |

(Continued)

FOREIGN PATENT DOCUMENTS

| CN | 101410759 | 4/2009 |
| CN | 105578076 | 5/2016 |

(Continued)

OTHER PUBLICATIONS

"International Search Report (Form PCT/ISA/210) of PCT/JP2021/003758," mailed on Apr. 13, 2021, with English translation thereof, pp. 1-5.

(Continued)

*Primary Examiner* — Hung H Lam
(74) *Attorney, Agent, or Firm* — JCIPRNET

(57) ABSTRACT

A CPU provided in an image display device of an image exposure device causes a display unit of the image display device to display a display image for divided exposure, which has a divided gradation value obtained by dividing a gradation value of a recorded image, and sequentially performs a plurality of exposures of the photosensitive recording medium by the display image for divided exposure to perform a divided exposure for recording the recorded image on the photosensitive recording medium.

14 Claims, 15 Drawing Sheets

(56) References Cited

U.S. PATENT DOCUMENTS

| | | | |
|---|---|---|---|
| 11,361,412 B2 | 6/2022 | Yoshizawa et al. | |
| 2008/0050032 A1* | 2/2008 | Okuno | G06T 3/403 |
| | | | 382/266 |
| 2015/0138526 A1* | 5/2015 | Degani | B41F 17/00 |
| | | | 359/641 |
| 2018/0330681 A1* | 11/2018 | Kurokawa | G02F 1/1339 |
| 2020/0394768 A1* | 12/2020 | Yoshizawa | H04N 23/76 |

FOREIGN PATENT DOCUMENTS

| | | | | |
|---|---|---|---|---|
| JP | 6-222467 | * | 8/1994 | H04N 1/036 |
| JP | H06222467 | | 8/1994 | |
| JP | 2001045342 | | 2/2001 | |
| JP | 2001-092016 | * | 4/2001 | H04N 1/00 |
| JP | 2001092016 | | 4/2001 | |
| JP | 2002019187 | | 1/2002 | |
| JP | 2006246080 | | 9/2006 | |
| WO | 2019187751 | | 10/2019 | |

OTHER PUBLICATIONS

"Written Opinion of the International Searching Authority (Form PCT/ISA/237)" of PCT/JP2021/003758, mailed on Apr. 13, 2021, with English translation thereof, pp. 1-21.
"Search Report of Europe Counterpart Application", issued on Jun. 29, 2023, p. 1-p. 8.
"Office Action of Japan Counterpart Application", issued on Aug. 1, 2023, with English translation thereof, p. 1-p. 8.
"Office Action of China Counterpart Application", issued on Sep. 28, 2023, with English translation thereof, p. 1-p. 22.
"Office Action of China Counterpart Application", issued on May 18, 2024, with English translation thereof, p. 1-p. 12.

* cited by examiner

DISPLAY IMAGE → RECORDED IMAGE

INPUT IMAGE → BLURRED IMAGE

HIGH-FREQUENCY COMPONENT IMAGE

DISPLAY IMAGE

FIG. 14

| GRADATION VALUE OF RECORDED IMAGE | DIVIDED GRADATION VALUE OF DISPLAY IMAGE FOR DIVIDED EXPOSURE | | | | TOTAL AMOUNT OF LIGHT |
|---|---|---|---|---|---|
| | FIRST TIME | SECOND TIME | THIRD TIME | FOURTH TIME | |
| 1 | 1 | 0 | 0 | 0 | 25 |
| 2 | 1 | 1 | 0 | 0 | 50 |
| 3 | 1 | 1 | 1 | 0 | 75 |
| 4 | 1 | 1 | 1 | 1 | 100 |
| 5 | 2 | 1 | 1 | 1 | 125 |
| 6 | 2 | 2 | 1 | 1 | 150 |
| 7 | 2 | 2 | 2 | 1 | 175 |
| 8 | 2 | 2 | 2 | 2 | 200 |
| 9 | 3 | 2 | 2 | 2 | 225 |
| 10 | 3 | 3 | 2 | 2 | 250 |
| 11 | 3 | 3 | 3 | 2 | 275 |
| 12 | 4 | 4 | 4 | 4 | 300 |
| ⋮ | ⋮ | ⋮ | ⋮ | ⋮ | ⋮ |
| 1023 | 256 | 256 | 256 | 255 | 25575 |
| 1024 | 256 | 256 | 256 | 256 | 25600 |

FIG. 15

| GRADATION VALUE OF RECORDED IMAGE | GRADATION VALUE OF DISPLAY IMAGE | AMOUNT OF LIGHT |
|---|---|---|
| 1 | 1 | 100 |
| 2 | 2 | 200 |
| 3 | 3 | 300 |
| ⋮ | ⋮ | ⋮ |
| 255 | 255 | 25500 |
| 256 | 256 | 25600 |

IMAGE EXPOSURE DEVICE, IMAGE EXPOSURE METHOD, AND PROGRAM

CROSS-REFERENCE TO RELATED APPLICATION

This application is a continuation application of International Application No. PCT/JP2021/003758, filed Feb. 2, 2021, the disclosure of which is incorporated herein by reference in its entirety. Further, this application claims priority from Japanese Patent Application No. 2020-025671 filed on Feb. 18, 2020, the disclosure of which is incorporated herein by reference in its entirety.

BACKGROUND

1. Technical Field

The present disclosure relates to an image exposure device, an image exposure method, and a program.

2. Description of the Related Art

There is known an image exposure device that records a recorded image corresponding to a display image displayed by an image display device on a photosensitive material by exposing the photosensitive material such as a photosensitive recording medium with light emitted from the image display device.

For example, in a technique described in JP2001-45342A, there is known a technique of exposing a display image displayed on a liquid crystal display to a photosensitive material by guiding light from the liquid crystal display to the photosensitive material. Further, in the technique described in JP2001-45342A, an optical fiber array is provided between the liquid crystal display and the photosensitive material as a guiding unit for guiding the light from the liquid crystal display to the photosensitive material.

SUMMARY

In a case where a photosensitive material such as a photosensitive recording medium is exposed by light emitted from an image display device, the gradation of the recorded image recorded on the photosensitive material depends on the gradation of the display image displayed on the image display device for exposure. In other words, the gradation that can be expressed in the recorded image depends on the gradation of the image display device.

Therefore, it may not be possible to record a recorded image having more gradations than the gradation of the display image displayed on the image display device on the photosensitive material. In the technique described in JP2001-45342A, the gradation of the display image displayed on the liquid crystal display and the gradation of the recorded image recorded on the photosensitive material are the same.

The present disclosure has been made in view of such circumstances, and provides an image exposure device, an image exposure method, and a program capable of recording a recorded image having more gradations than the gradation of a display image displayed on an image display device on a photosensitive recording medium.

According to a first aspect of the present disclosure, there is provided an image exposure device comprising: an image display device having a plurality of pixels; a support portion that supports a photosensitive recording medium for recording a display image displayed on the image display device in a state in which an exposure surface of the photosensitive recording medium faces the image display device; a limiting member that is provided between the image display device and the support portion and limits an angle of light emitted from the image display device to the photosensitive recording medium; at least one processor; and a memory that stores instructions that are able to be executed by the processor, in which the processor is configured to cause the image display device to display a display image for divided exposure, which has a divided gradation value obtained by dividing a gradation value of a recorded image, and sequentially perform a plurality of exposures of the photosensitive recording medium by the display image for divided exposure to perform a divided exposure for recording the recorded image on the photosensitive recording medium.

According to a second aspect of the present disclosure, in the image exposure device according to the first aspect, a sum of the divided gradation values of the display image for divided exposure used for each exposure in the divided exposure exceeds a maximum gradation number, which is a maximum value of gradations that are able to be displayed on the image display device.

According to a third aspect of the present disclosure, in the image exposure device according to the second aspect, the sum of the divided gradation values is the same as the gradation value of the recorded image.

According to a fourth aspect of the present disclosure, in the image exposure device according to any one of the first to third aspects, the number of exposures in the divided exposure is an integer rounded up to a first decimal point of a value obtained by dividing the number of gradations of the recorded image by the maximum gradation number.

According to a fifth aspect of the present disclosure, in the image exposure device according to any one of the first to fourth aspects, an exposure time of each exposure in the divided exposure is the same.

According to a sixth aspect of the present disclosure, in the image exposure device according to the fifth aspect, the exposure time of each exposure in the divided exposure is a time obtained by dividing an exposure time during which a recorded image having the maximum gradation number is able to be recorded on the photosensitive recording medium by a display image having the maximum gradation number by the number of exposures.

According to a seventh aspect of the present disclosure, in the image exposure device according to any one of the first to sixth aspects, the processor is configured to specify the divided gradation value of the display image for divided exposure used for each exposure in the divided exposure, and control an amount of light of the display image for divided exposure according to the specified divided gradation value.

According to an eighth aspect of the present disclosure, in the image exposure device according to the seventh aspect, in the divided exposure, a difference between the divided gradation value of the display image for divided exposure used for an n-th exposure and the divided gradation value of the display image for divided exposure used for an n+1-th exposure is 1 or −1.

According to a ninth aspect of the present disclosure, in the image exposure device according to any one of the first to eighth aspects, image data of an input image having the same gradation value as the gradation value of the recorded image is input, and the processor is configured to generate the display image for divided exposure from the input image.

According to a tenth aspect of the present disclosure, in the image exposure device according to any one of the first to ninth aspects, the processor is configured to generate a display image for divided exposure of an R component, a display image for divided exposure of a G component, and a display image for divided exposure of a B component from a color input image represented by the input image data, and sequentially display each of the display image for divided exposure of the R component, the display image for divided exposure of the G component, and the display image for divided exposure of the B component on the image display device in a predetermined order, and perform the divided exposure for each color of RGB.

According to an eleventh aspect of the present disclosure, in the image exposure device according to any one of the tenth aspect, a total amount of light for exposing the photosensitive recording medium is determined for each color of RGB, and the processor is configured to sequentially expose the photosensitive recording medium by each of the display image for divided exposure of the R component, the display image for divided exposure of the G component, and the display image for divided exposure of the B component at an exposure time corresponding to a maximum amount of light of each color of RGB displayed on the image display device and the total amount of light, and perform the divided exposure for each color of RGB.

According to a twelfth aspect of the present disclosure, in the image exposure device according to any one of the first to eleventh aspects, the processor is configured to generate the display image for divided exposure in which an image quality of an input image represented by the input image data is deteriorated by emphasizing a density difference of a high-frequency component of the input image.

According to a thirteenth aspect of the present disclosure, in the image exposure device according to any one of the first to twelfth aspects, the limiting member is an optical member of a diffusion optical system.

According to a fourteenth aspect of the present disclosure, there is provided an image exposure method in an image exposure device including an image display device having a plurality of pixels, a support portion that supports a photosensitive recording medium for recording a display image displayed on the image display device in a state in which an exposure surface of the photosensitive recording medium faces the image display device, and a limiting member that is provided between the image display device and the support portion and limits an angle of light emitted from the image display device to the photosensitive recording medium, the method causing a computer to execute a process comprising: causing the image display device to display a display image for divided exposure, which has a divided gradation value obtained by dividing a gradation value of a recorded image; and sequentially performing a plurality of exposures of the photosensitive recording medium by the display image for divided exposure to perform a divided exposure for recording the recorded image on the photosensitive recording medium.

According to a fifteenth aspect of the present disclosure, there is provided a program for causing a computer to execute a process on an image exposure device including an image display device having a plurality of pixels, a support portion that supports a photosensitive recording medium for recording a display image displayed on the image display device in a state in which an exposure surface of the photosensitive recording medium faces the image display device, and a limiting member that is provided between the image display device and the support portion and limits an angle of light emitted from the image display device to the photosensitive recording medium, the process comprising: causing the image display device to display a display image for divided exposure, which has a divided gradation value obtained by dividing a gradation value of a recorded image; and sequentially performing a plurality of exposures of the photosensitive recording medium by the display image for divided exposure to perform a divided exposure for recording the recorded image on the photosensitive recording medium.

According to the aspects of the present disclosure, it is possible to record a recorded image having more gradations than the gradation of the display image displayed on the image display device on a photosensitive recording medium.

BRIEF DESCRIPTION OF THE DRAWINGS

Exemplary embodiments according to the technique of the present disclosure will be described in detail based on the following figures, wherein:

FIG. 14 is a diagram showing an example of a correspondence of a gradation value of a recorded image, a divided gradation value of a display image for divided exposure, and a total amount of light (total light amount) emitted to a photosensitive recording medium, FIG. 15 is a diagram showing an example of a correspondence of a gradation value of a recorded image of 256 gradations, a gradation value of a display image, and an amount of light emitted to a photosensitive recording medium 14 in a case where the recorded image is recorded on the photosensitive recording medium with one exposure.

DETAILED DESCRIPTION

Hereinafter, an image exposure device of the present embodiment will be described with reference to the drawings.

First Embodiment (Image Exposure Device)

Figure 1:
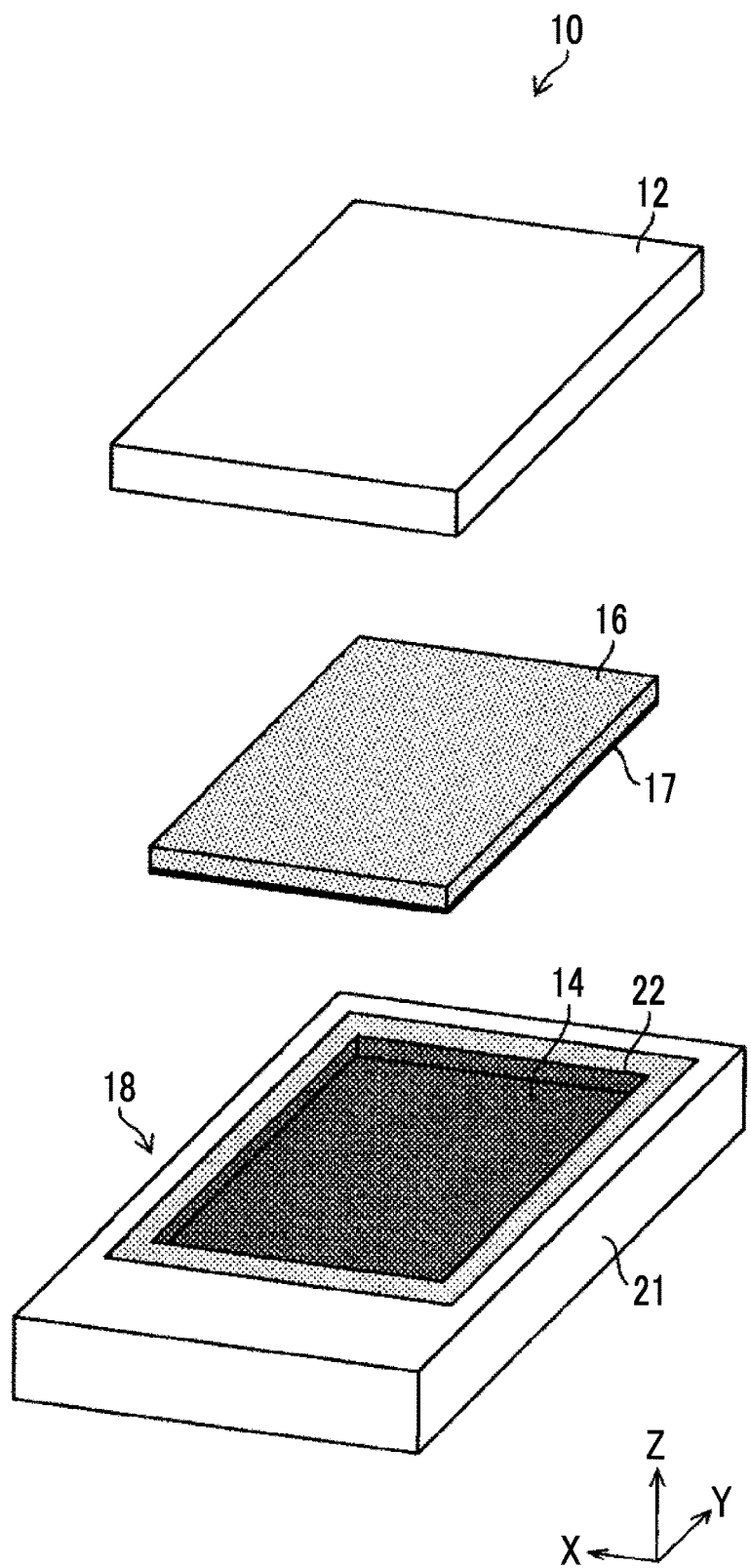
FIG. 1 is an exploded perspective view of an example of an image exposure device of a first embodiment.

First, the configuration of an image exposure device of the present embodiment will be described. FIG. 1 shows an exploded perspective view of an example of the image exposure device of the present embodiment. Further, FIG. 2 shows a cross-sectional view of an example of the image exposure device of the present embodiment.

Figure 2:
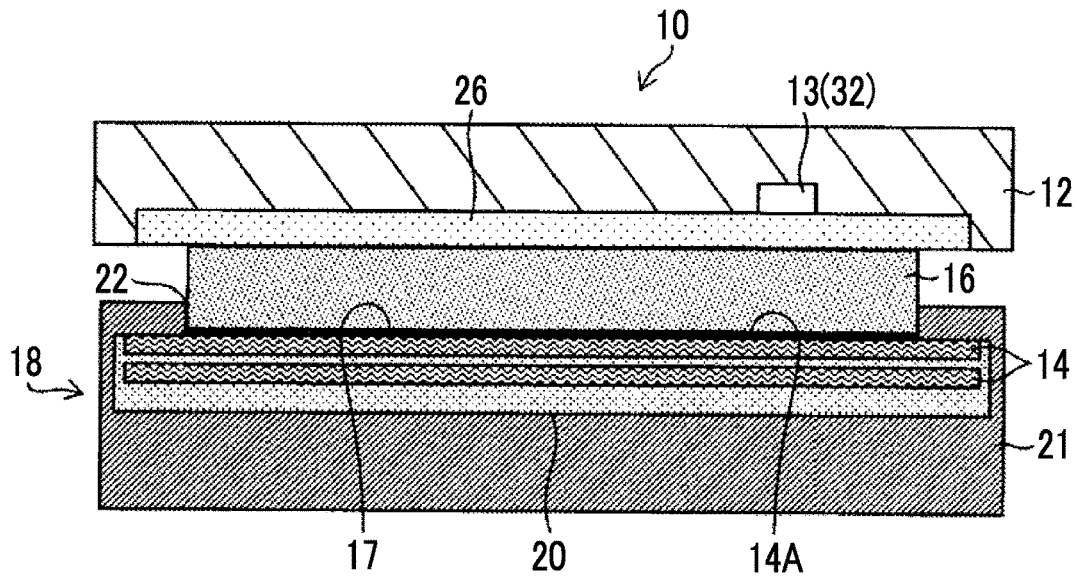
FIG. 2 is a cross-sectional view of an example of the image exposure device of the first embodiment.

As shown in FIGS. 1 and 2, an image exposure device 10 of the present embodiment comprises an image display device 12, a support portion 21, and a louver film 16. The image display device 12 has a plurality of pixels 13. The support portion 21 supports a photosensitive recording medium 14 on which a recorded image corresponding to a display image displayed by the image display device 12 is recorded. The louver film 16 is provided between the image display device 12 and the support portion 21, and a protective layer 17 is provided on the support portion 21 side thereof

[Image Display Device]

As the image display device 12 of the present embodiment, a mobile terminal such as a smartphone and a tablet PC, a liquid crystal display (LCD), an organic light emitting diode (OLED), a cathode ray tube (CRT), a light emitting diode (LED), a plasma display device, or the like can be used.

Figure 3:
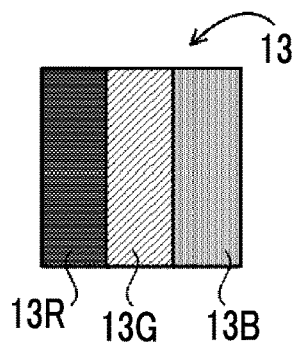
FIG. 3 is a diagram showing an example of a pixel of the first embodiment.

The image display device 12 comprises a plurality of pixels 13 as a display unit 32 for displaying a display image. FIG. 2 shows one pixel 13 as an example of the display unit 32. The pixel 13 is a minimum unit of color information constituting an image display surface. Since the pixel 13 is provided, the image display device 12 can display a display image. FIG. 3 shows an example of the pixel 13 of the present embodiment. The pixel 13 includes three sub-pixels. Specifically, as shown in FIG. 3, in the pixel 13, a sub-pixel 13R corresponding to a red (R) color, a sub-pixel 13G corresponding to a green (G) color, and a sub-pixels 13B corresponding to a blue (B) color are disposed in a row. A plurality of pixels 13 are arranged two-dimensionally on a pixel display surface of the image display device 12. Since the pixel 13 is provided, the image display device 12 can display a color display image. The two-dimensional in the arrangement of the pixels 13 means a state extending in X-Y directions in FIG. 1. By setting the distance (pitch) between the adjacent pixels 13 to 200 μm or less, the impression of the recorded image as a natural image can be strengthened. Therefore, the pitch of the pixel 13 is preferably 150 μm or less, more preferably 125 μm or less, and even more preferably 85 μm or less.

A glass window 26 for protecting the pixel 13 is provided on a surface side irradiated with light from the image display device 12. The thickness of the glass window 26 is preferably thin in order to shorten the distance from the pixel 13 to the photosensitive recording medium 14.

Figure 4:
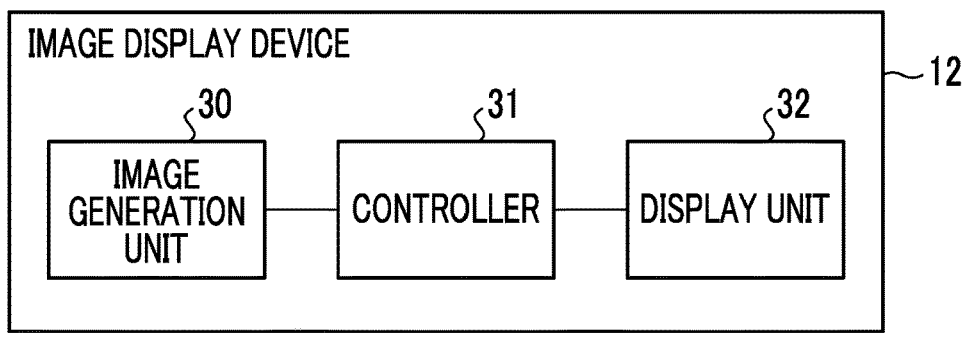
FIG. 4 is a block diagram showing an example of a functional configuration of an image display device of the first embodiment.

In addition, FIG. 4 is a block diagram showing an example of a functional configuration of the image display device 12 of the present embodiment. The image display device 12 of the present embodiment comprises an image generation unit 30, a controller 31, and a display unit 32.

The image generation unit 30 of the present embodiment generates a display image in which an image quality of the input image is deteriorated by emphasizing a density difference of a high-frequency component of the input image, and outputs image data representing the generated display image to the controller 31.

The controller 31 performs control such that the photosensitive recording medium 14 is exposed by displaying a display image corresponding to the input image represented by the image data input from the image generation unit 30 on the display unit 32, and a recorded image corresponding to the input image represented by the image data is recorded on the photosensitive recording medium 14.

In the image exposure device 10 of the present embodiment, the gradation of the recorded image can be increased more than the gradation of the display image displayed on the display unit 32. Therefore, the controller 31 controls the photosensitive recording medium 14 to record a recorded image having a larger number of gradations than a maximum gradation number, which is a maximum value of the number of gradations that can be displayed on the display unit 32. The number of gradations of the input image in the present embodiment is the same as the number of gradations of the recorded image. Therefore, for example, in the image exposure device 10 of the present embodiment, even in a case where the display unit 32 is a liquid crystal display with 256 gradations (8 bits) and the gradation of the input image is 1024 gradations, a recorded image of 1024 gradations can be recorded on the photosensitive recording medium 14. The specific configuration of the display unit 32 is not particularly limited as long as it includes the above-mentioned pixels 13 and emits light according to the display image represented by the pixels 13. As such a display unit 32, for example, a liquid crystal in which a lamp such as a backlight radiates light may be applied, or for example, a light emitting diode in which the display unit 32 itself radiates light may be applied.

The controller 31 of the present embodiment causes the display unit 32 to display a display image for divided exposure having a divided gradation value obtained by dividing the gradation value of the recorded image, and exposes the photosensitive recording medium 14 a plurality of times. The controller 31 controls the total amount of light emitted to the photosensitive recording medium 14 to be the amount of light according to the gradation of the input image by performing the exposure a plurality of times, thereby recording a recorded image having the same gradation as the gradation of the input image on the photosensitive recording medium 14. Hereinafter, the main exposure method that enables exposure of a recorded image having more gradations than the maximum gradation number of the display unit 32 by displaying a display image for divided exposure having a divided gradation value obtained by dividing the gradation value of the recorded image on the display unit 32 is referred to as "divided exposure".

Further, the controller 31 of the present embodiment generates a display image for divided exposure of a red (R) component, a display image for divided exposure of a green (G) component, and a display image for divided exposure of a blue (B) component from the display image which is a color image. Further, the controller 31 causes the display unit 32 to sequentially display the display image for divided exposure of the R component, the display image for divided exposure of the G component, and the display image for divided exposure of the B component in a predetermined order.

By sequentially displaying each of the display image for divided exposure of the R component, the display image for divided exposure of the G component, and the display image for divided exposure of the B component on the display unit 32, the photosensitive recording medium 14 is sequentially exposed by each of the display image for divided exposure of the R component, the display image for divided exposure of the G component, and the display image for divided exposure of the B component. Hereinafter, the main exposure method is referred to as "RGB sequential exposure" for convenience. Although it is referred to as "RGB sequential exposure", the order of exposure is optional and is not limited to the order of RGB.

Figure 5:
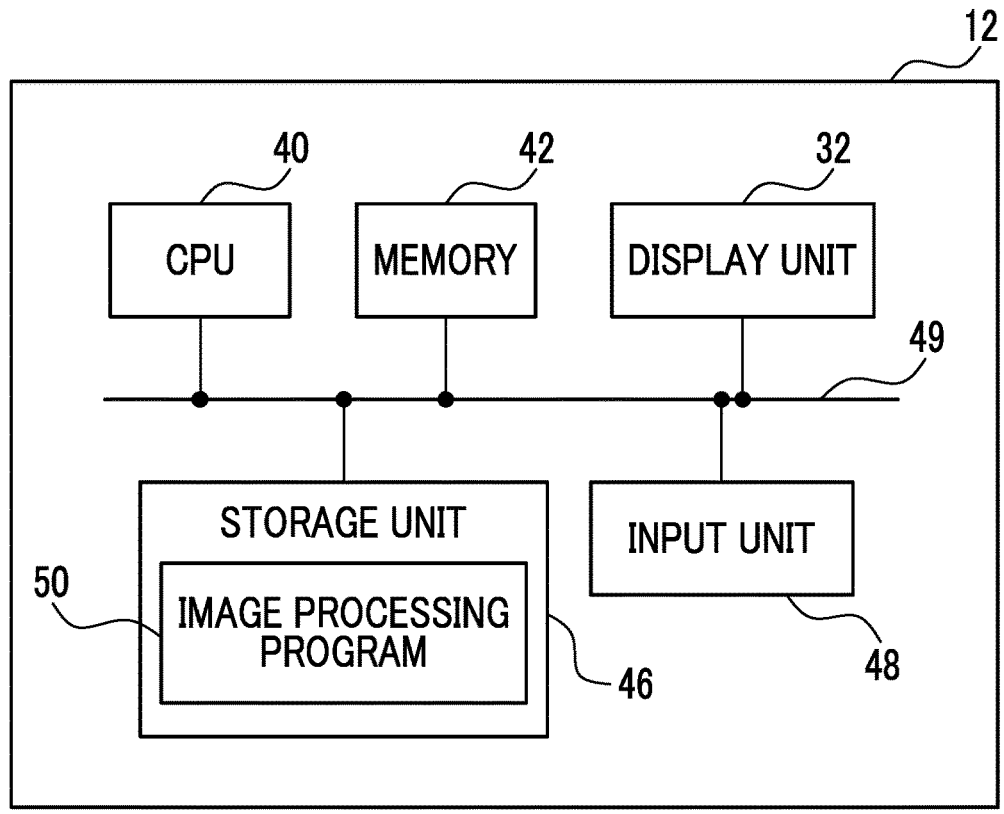
FIG. 5 is a diagram illustrating a hardware configuration of the image display device of the first embodiment.

Next, a hardware configuration of the image display device 12 will be described with reference to FIG. 5. As shown in FIG. 5, the image display device 12 has a computer comprising a central processing unit (CPU) 40, a memory 42 as a temporary storage area, and a nonvolatile storage unit 46. In addition, the image display device 12 comprises the display unit 32 described above and an input unit 48. The CPU 40, the memory 42, the storage unit 46, the input unit 48, and the display unit 32 are connected via a bus 49.

The storage unit 46 is realized by a hard disk drive (HDD), a solid state drive (SSD), a flash memory, and the like. An exposure processing program 50 is stored in the storage unit 46 as a storage medium. The CPU 40 reads the exposure processing program 50 from the storage unit 46, loads the read exposure processing program 50 in the memory 42, and then executes the exposure processing program 50. In a case where the CPU 40 executes the exposure processing program 50, the CPU 40 functions as the image generation unit 30 and the controller 31 shown in FIG. 4.

The image data of the input image is input to the input unit 48. As described above, the gradation of the input image of the present embodiment is 1024 gradations. As an example, image data in which a gradation value (gradation value for 1024 gradations) is added to each pixel of an image of 256 gradations is used as the image data of the input image. The image data of the input image may be input from the outside of the image display device 12 or the image exposure device 10, or in a case where the image display device 12 or the image exposure device 10 itself has a function of forming or capturing an image, the image data formed or captured by itself may be input.

[Support Portion]

The support portion 21 of the present embodiment supports the photosensitive recording medium 14 in a state of being disposed at a position facing the surface irradiated with light from the image display device 12. The support portion 21 may directly or indirectly support the photosensitive recording medium 14, and the structure thereof is not particularly limited as long as the support portion 21 can support the photosensitive recording medium 14.

[Photosensitive Recording Medium]

As shown in FIG. 2, the photosensitive recording medium 14 of the present embodiment has an exposure surface 14A. The photosensitive recording medium 14 is not particularly limited as long as the photosensitive recording medium 14 can be exposed to light emitted from the image display device 12 and can form a recorded image. For example, it is possible to use a film pack 18 or the like to be attached to an instant camera (for example, manufactured by Fujifilm Corporation, Instax (registered trademark), (trade name: Cheki)).

The film pack 18 is formed by incorporating the photosensitive recording medium 14 into a case 20. A light shielding sheet (not shown) is provided between a plurality of the photosensitive recording mediums 14 provided in the case 20 and only the photosensitive recording medium 14 present on the uppermost surface of the film pack 18 is exposed by the light shielding sheet. In a case where the film pack 18 to be attached to the Instax (registered trademark) is applied, the photosensitive recording medium 14 and the light shielding sheet are incorporated in the film. As a material used for the photosensitive recording medium 14, for example, photographic photosensitive materials such as a negative film, a reversal film, printing paper, and a mono-sheet or peel-apart type instant photographic film can be exemplified.

As shown in FIG. 2, a plurality of photosensitive recording mediums 14 are packed in a box-like case 20 having light shielding properties. In the case 20, an exposure aperture 22 through which light emitted from the image display device 12 passes is provided in order to expose the exposure surface of the photosensitive recording medium 14. In addition, a pressing member (not shown) is provided on the side opposite to the exposure aperture 22, and the photosensitive recording medium 14 is pressed toward the exposure aperture 22 side by using the pressing member. Therefore, the photosensitive recording medium 14 is pressed against the periphery of the exposure aperture 22, the distance from the image display device 12 becomes close, and a favorable image can be recorded on the photosensitive recording medium 14.

As the case 20, a resin member for a recording material that is used for various recording materials such as a photographic photosensitive material, a magnetic recording material, and an optical recording material can be used. The resin member for the recording material refers to a case, a lid, and an accessory supplemented thereto which are used to contain, pack, coat, protect, transport, or store the recording material, and support the form of the recording material or various members that mount the recording material and exhibit a function.

The photosensitive recording medium 14 after exposure passes through between developing rollers (not shown), whereby a pod portion provided in the photosensitive recording medium breaks. A development treatment liquid is encompassed in the pod portion, and the breakage of the pod portion causes the development treatment liquid to spread in the photosensitive recording medium 14. After one to several minutes elapses, a development treatment is sufficiently advanced, and a recorded image is formed on the photosensitive recording medium 14.

[Louver Film]

Figure 6:
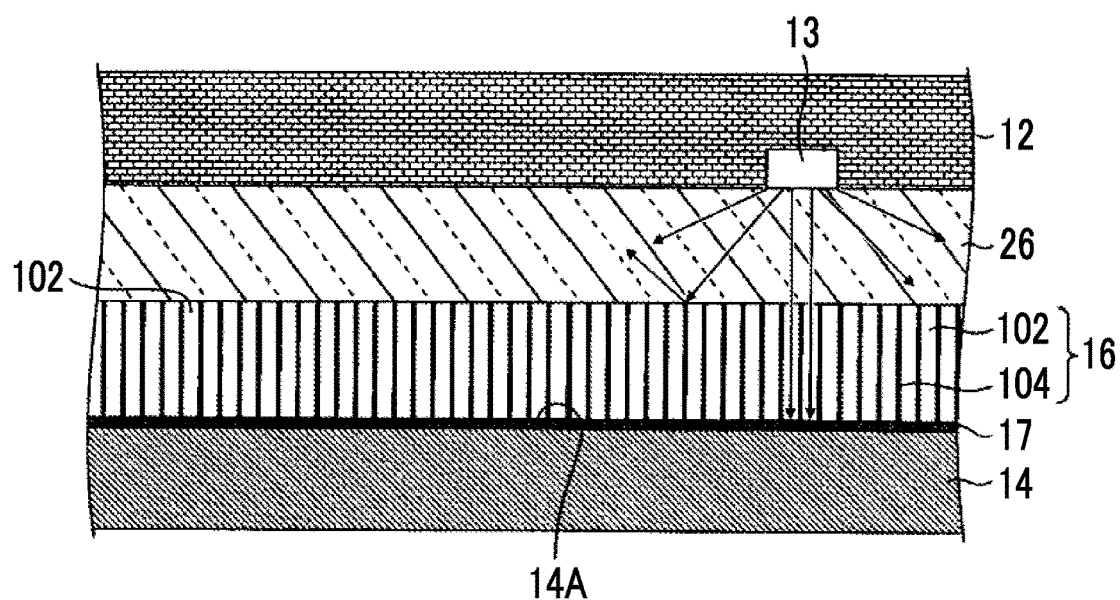
FIG. 6 is a schematic cross-sectional view for describing a traveling direction of light in the image exposure device of the first embodiment.
Figure 7:
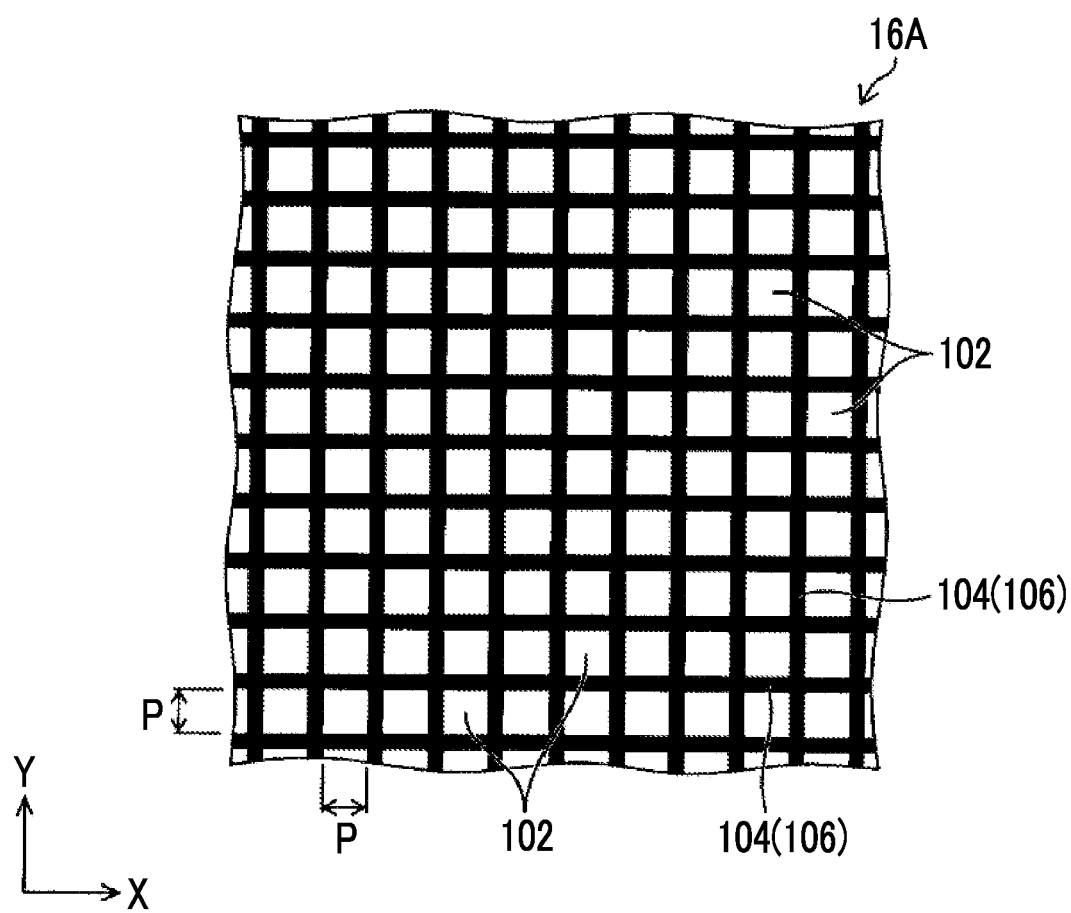
FIG. 7 is a diagram showing a configuration of an example of a louver film of the first embodiment.
Figure 7:
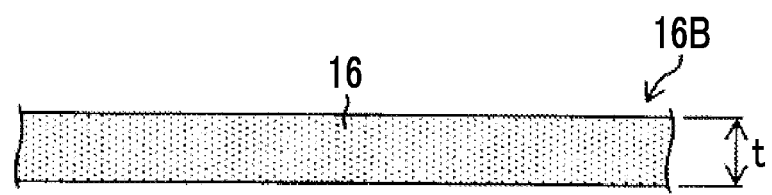

An example of the louver film 16 of the present embodiment will be described with reference to FIGS. 6 and 7. FIG. 6 is a schematic cross-sectional view of an example of the image exposure device 10 of the present embodiment, and is a view for describing a traveling direction of light from the pixel 13. FIG. 7 is a diagram showing a configuration of an example of the louver film 16 of the present embodiment. Reference numeral 16A denotes a planar surface 16A of the louver film 16, and reference numeral 16B denotes a side surface 16B of the louver film 16. In the louver film 16, light transmission parts 102 that transmit light and light shielding parts 104 that block light are alternately disposed in the first direction (X direction in the planar surface 16A in FIG. 7) on a surface parallel to an arrangement surface where the pixels 13 of the image display device 12 are arranged. The light transmission parts 102 and the light shielding parts 104 disposed in the first direction of the present embodiment are examples of first light transmission parts and first light shielding parts of the present disclosure.

In addition, in the louver film 16, the light transmission parts 102 and the light shielding parts 104 are alternately disposed in the second direction (Y direction in the planar surface 16A in FIG. 7) perpendicular to the first direction on the surface parallel to the surface where the pixels of the image display device are arranged. The light transmission parts 102 and the light shielding parts 104 disposed in the second direction of the present embodiment are examples of second light transmission parts and second light shielding parts of the present disclosure.

In this way, in the present embodiment, the light transmission parts 102 are two-dimensionally disposed, and the light shielding parts 104 are formed in a lattice form. With such a configuration, as shown in FIG. 6, an angle of light emitted from the pixel 13 of the image display device 12 to the exposure surface 14A of the photosensitive recording medium 14 is limited. The louver film 16 of the present embodiment is an example of a limiting member of the present disclosure.

The light emitted from the pixel 13 of the image display device 12 is emitted in all directions of 180° from an image display surface. The emitted light passes through the glass window 26 provided in the image display device 12 and is incident on the louver film 16. In the light incident on the louver film 16, light parallel to a straight line connecting the image display device 12 and the photosensitive recording medium 14 passes through the light transmission parts 102 of the louver film 16. In addition, light emitted obliquely to the straight line connecting the image display device 12 and the photosensitive recording medium 14 is blocked by the light shielding parts 104 in the louver film 16. By limiting the angle of the light emitted from the image display device 12, the image quality of the recorded image recorded on the photosensitive recording medium 14 is improved.

The light transmission parts 102 only need to be able to pass through light, and can be provided using a glass material, a transparent silicone rubber, or the like. In addition, portions of the light transmission parts 102 can be provided as cavities, and the louver film 16 can be composed of only the light shielding parts 104. The light shielding parts 104 may be a light absorbing member that absorbs light, or can be a light reflecting member that reflects light. A light shielding member 106 constituting the light shielding parts 104 can use a colored resin material such as a black silicone rubber, for example. In addition, as the material that absorbs light, a neutral density filter (ND filter) can be used. The ND filter means a filter having a neutral optical density, and can absorb light evenly in a wavelength region used for exposure without giving an influence on the wavelength (absorbance of 50% or more to 99.999% or less; light transmittance of 0.001% or more to 50% or less).

Figure 8:
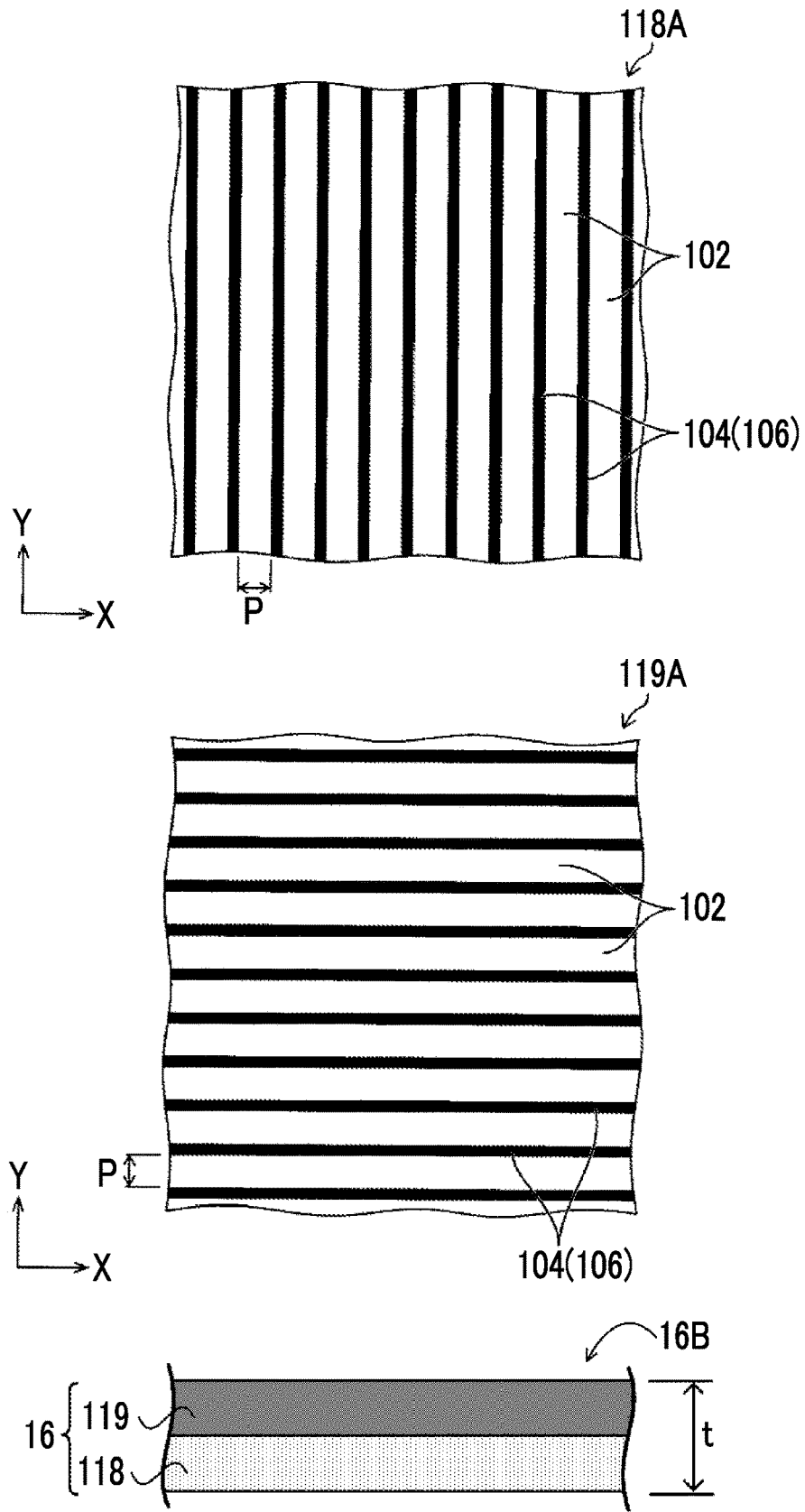
FIG. 8 is a diagram showing a configuration of another example of the louver film of the first embodiment.

The configuration of the louver film 16 is not limited to the present embodiment. FIG. 8 shows a configuration of another example of the louver film 16. The louver film 16 shown in FIG. 7 is formed of one layer as shown in the side surface 16B, and the light transmission parts 102 and the light shielding parts 104 are alternately disposed in the one layer in the first direction and the second direction. Thus, the louver film 16 with a two-dimensional arrangement is formed.

On the other hand, the louver film 16 shown in FIG. 8 is composed of two layers of the first layer 118 and the second layer 119. Reference numeral 16B denotes a side surface of the louver film 16, reference numeral 118A denotes a planar surface of the first layer 118, and reference numeral 119A denotes a planar surface of the second layer 119. As shown in the planar surface 118A of the first layer 118, in the first layer 118, the light transmission parts 102 and the light shielding parts 104 are alternately disposed only in the first direction (X direction in the planar surface 118A in FIG. 8). In the second layer 119, the light transmission parts 102 and the light shielding parts 104 are alternately disposed only in the second direction perpendicular to the first direction (Y direction in the planar surface 119A in FIG. 8). The first layer 118 and the second layer 119 are laminated to form a two-dimensional louver film 16. Thus, even in a case where the two-dimensional louver film 16 is formed with a plurality of layers, the same effect as that of the louver film 16 formed of one layer can be obtained.

Figure 9A:
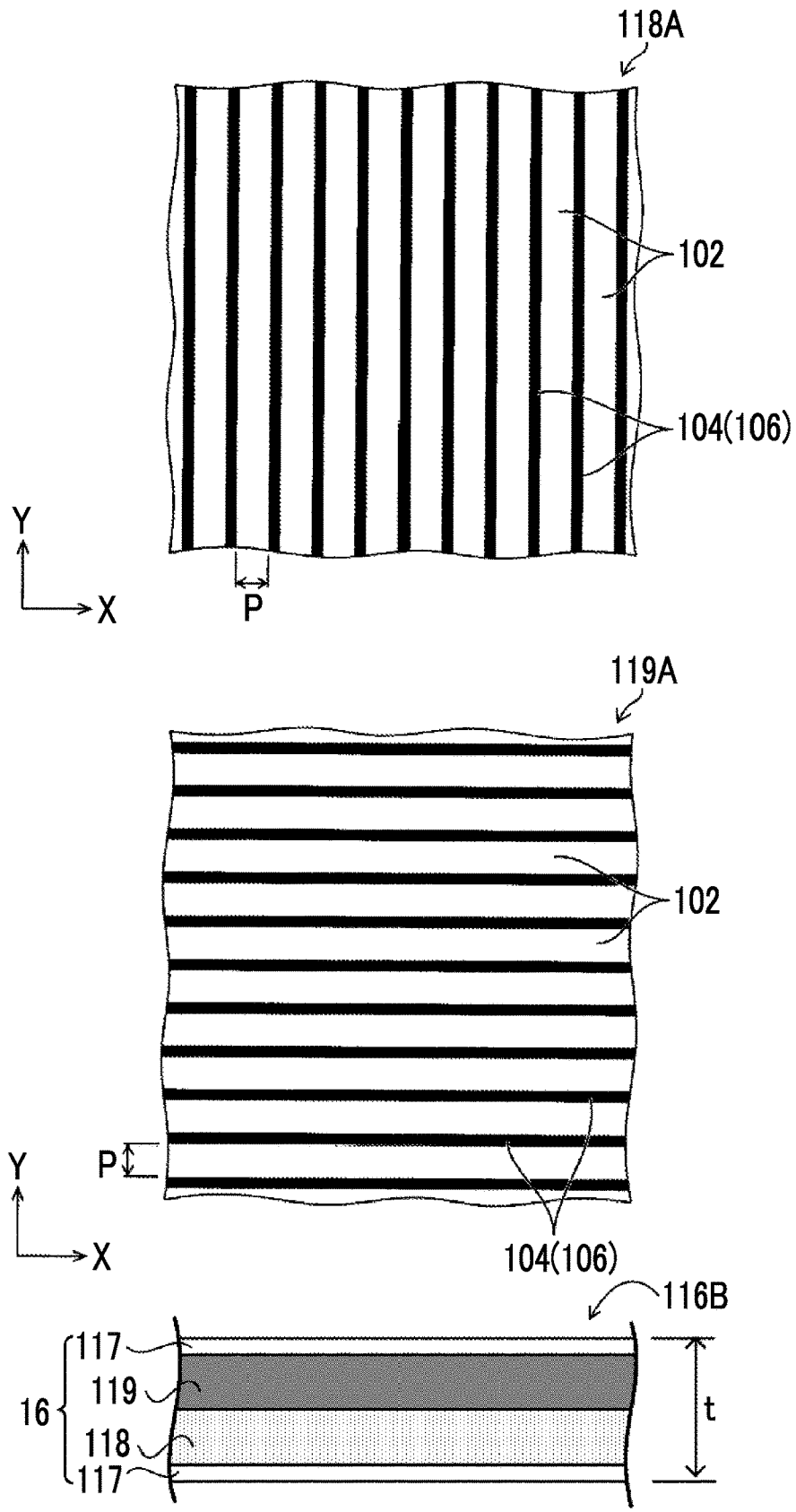
FIG. 9A is a diagram showing a configuration of another example of the louver film of the first embodiment.

Further, as shown in FIG. 9A, the louver film 16 may have a form in which a protective layer 117 for preventing the louver film 16 from being damaged or broken is provided on the surface thereof. Specifically, the louver film 16 may have a form in which a protective layer 117 is provided on each of the planar surface 118A of the first layer 118 on the side opposite to the side in contact with the second layer 119 and the planar surface 119A of the second layer 119 on the side opposite to the side in contact with the first layer 118. As shown in FIG. 9A, in a case where the protective layer 17 is provided on both sides of the louver film 16, it is possible to make the image defect generated based on the defect or the structure of the louver film 16 inconspicuous.

The protective layer 117 is not particularly limited as long as it is transparent and can transmit light. For the protective layer 117, for example, a plastic plate formed of an acrylic resin, a polycarbonate, a vinyl chloride resin, or the like can be used.

Figure 9B:
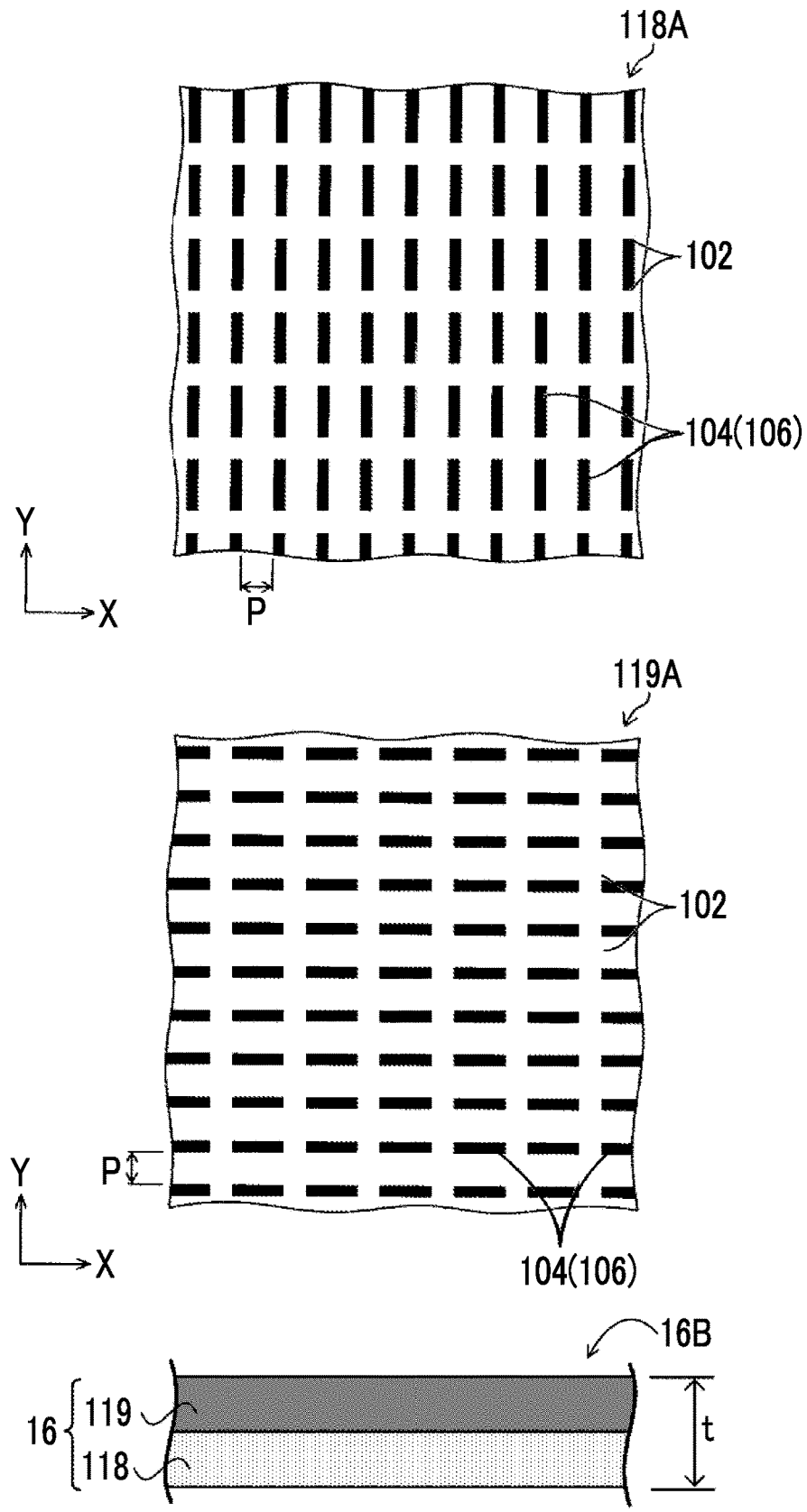
FIG. 9B is a diagram showing a configuration of another example of the louver film of the first embodiment.

Furthermore, as shown in FIG. 9B, at least one of the light shielding parts 104 in each column and each row may be composed of a plurality of light shielding members 106 having intervals. In the example shown in FIG. 9B, in the first layer 118, each column of light shielding parts 104 arranged along the first direction has a plurality of light shielding members 106 provided at predetermined intervals along the second direction. In the second layer 119, each row of light shielding parts 104 arranged along the second direction has a plurality of light shielding members 106 provided at predetermined intervals along the first direction.

A pitch P of the light shielding parts 104 of the louver film 16 is preferably 80 µm or less, and more preferably 65 µm or less. In a case where the pitch P of the light shielding parts 104 is set to be in the above-described range, it is possible to block obliquely radiated light in light emitted from the pixel 13, and to improve the image quality of the recorded image.

The light shielding parts 104 may be disposed with a difference in an angle between XY axes of the pixel as a reference for the arrangement of the pixel 13 and an angle between XY axes of the louver as the reference for the arrangement of the light transmission parts 102 and the light shielding parts 104 of the louver film 16. Moire of the recorded image is suppressed by disposing the pixel 13 with the difference in the angle between the XY axes of the pixel 13 and the XY axes of the louver. The difference of the angle is preferably 1 degree to 45 degrees, more preferably 5 degrees to 40 degrees, and even more preferably 10 degrees to 35 degrees.

A thickness t of the louver film 16 is preferably 1.5 mm or more and 4.0 mm or less, more preferably 2.0 mm or more and 4.0 mm or less, and still more preferably 2.5 mm or more and 4.0 mm or less. By increasing the thickness t of the louver film 16, oblique light at a small angle with respect to parallel light can be blocked. In addition, in a case where the thickness t of the louver film 16 is increased, the recorded image is likely to be blurred and thus, the thickness t of the louver film 16 is preferably in the above-described range. The thickness t of the louver film 16 is the thickness of one layer in a case where it is formed of one layer as in the louver film 16 shown in FIG. 7. Further, in a case where the film is formed of a plurality of layers such as two layers of the first layer 118 and the second layer 119 as in the louver film 16 shown in FIGS. 8 to 9B, the total thickness of the plurality of layers is the thickness t of the louver film 16.

[Protective Layer]

The protective layer 17 is provided on the support portion 21 side of the louver film 16 as shown in FIGS. 1, 2, and 6. The protective layer 17 protects the louver film 16 in a case where the photosensitive recording medium 14 and the louver film 16 are in contact with each other during exposure. The protective layer 17 prevents the louver film 16 from being damaged or broken by repeated exposure of the display image displayed on the image display device 12 to the photosensitive recording medium 14.

The protective layer 17 is not particularly limited as long as it is transparent and can transmit light. For the protective layer 17, for example, a plastic plate formed of an acrylic resin, a polycarbonate, a vinyl chloride resin, or the like can be used.

The thickness of the protective layer 17 is preferably 0.1 µm or more and 500 µm or less. In a case where the thickness of the protective layer 17 is set to 0.1 µm or more, it is possible to make moire inconspicuous in addition to the effect of protecting the louver film 16. In addition, it is possible to make an image defect generated based on the defect or the structure of the louver film 16 inconspicuous. Further, in a case where the thickness of the protective layer 17 is set to 500 µm or less, the recorded image can be prevented from being blurred.

[Operation of Image Generation Unit 30]

Next, an operation of the image generation unit 30 of the image display device 12 of the present embodiment will be described.

Figure 10:
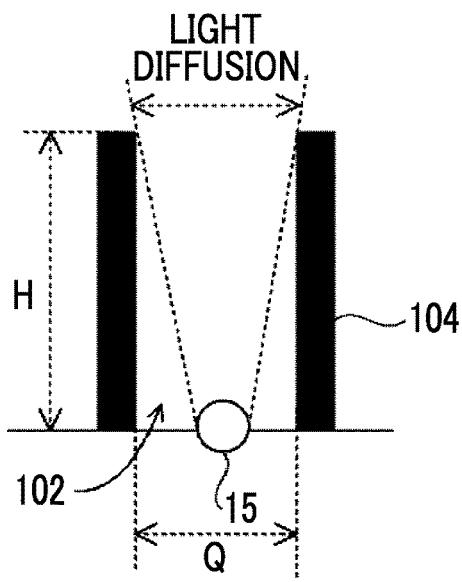
FIG. 10 is a diagram for describing the diffusion of light transmitted through the louver film.
Figure 11:
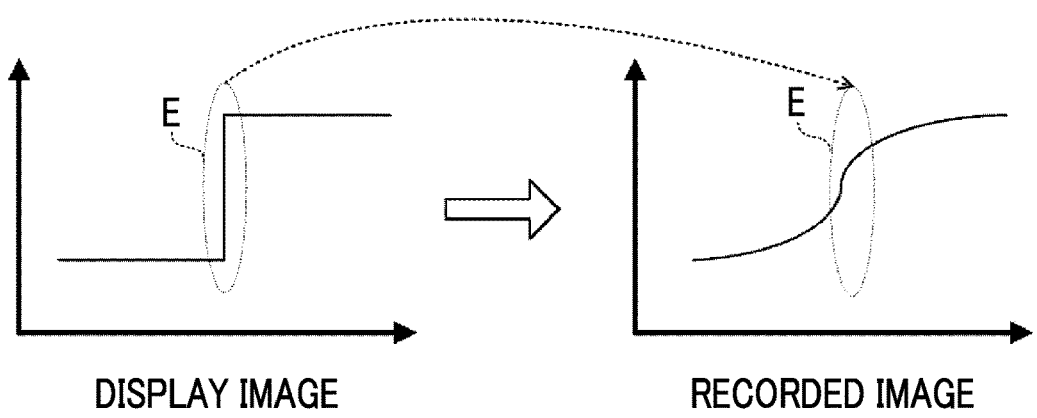
FIG. 11 is a diagram for describing a difference between a display image and a recorded image.

As described above, the angle of the light emitted from the image display device 12 is limited by the louver film 16, and the light parallel to the straight line connecting the image display device 12 and the photosensitive recording medium 14 passes through the light transmission parts 102 of the louver film 16. However, in actual fact, as shown in FIG. 10, light emitted from a point light source 15 of the display unit 32 is diffused. Specifically, according to the height H of the light shielding parts 104 and the width Q of the light transmission part 102, a light component having a predetermined angle is transmitted, that is, diffused. Due to the diffused light component, as shown in FIG. 11, in the recorded image recorded on the photosensitive recording medium 14, a density difference of a high-frequency component (edge portion) E is reduced as compared with the display image. That is, in the recorded image, since the density difference is small, the edge portion tends to be difficult to be visually recognized, and as a result, there is a high concern that the recorded image may become a blurred image.

As the thickness t of the louver film 16 increases, the amount of light reaching the photosensitive recording medium 14 from the image display device 12 decreases, so that there is a problem in that the exposure time is extremely long. In addition, as in the example shown in FIG. 8 or 9, in a case where the louver film 16 is formed of a plurality of layers, light is diffused in the directions not shielded by the light shielding parts 104 in each layer, and thus, blurring of the recorded image is likely to occur. Further, as the thickness of the protective layer 117 increases, the distance from the exposure surface 14A of the photosensitive recording medium 14 increases, and the angle of light is not limited in the protective layer 117, and thus, blurring of the recorded image is likely to occur.

Therefore, in the present embodiment, the image generation unit 30 of the image display device 12 performs high-frequency component emphasis processing to increase (emphasis) the high-frequency component (edge portion) of the display image in advance as image processing in consideration of the fact that the density difference is reduced in the recorded image rather than in the display image.

The image generation unit 30 of the present embodiment performs unsharp masking as an example of the high-frequency component emphasis processing. Specifically, first, an unsharp mask is generated. For the generation of the unsharp mask, for example, a two-dimensional Gaussian distribution is applied, in which f(x, y) is a filter coefficient and the degree of distribution is a standard deviation σ, as shown in the following expression (1).

$$f(x, y) = \frac{1}{2\pi\sigma^2} e^{-\frac{x^2+y^2}{2\sigma^2}} \quad (1)$$

The standard deviation σ in the above expression (1) is a Gaussian distribution, that is, the radius of blurring of a blurred image, and is denoted by the number of pixels in the present embodiment.

Figure 12A:
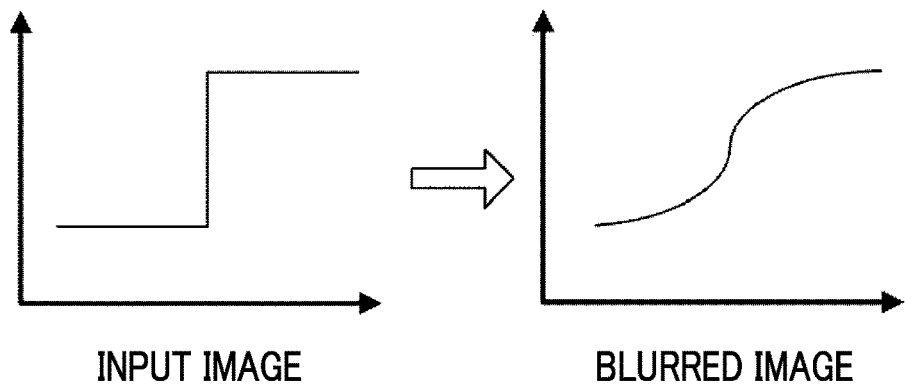
FIG. 12A is a diagram for describing an example of high-frequency component emphasis processing.

By multiplying the input image by the unsharp mask shown in the expression (1), the blurred image is generated from the input image as shown in FIG. 12A.

Figure 12B:
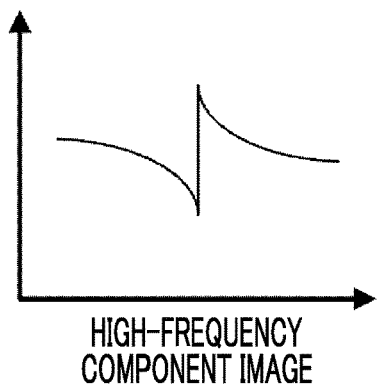
FIG. 12B is a diagram following FIG. 12A for describing an example of high-frequency component emphasis processing.

Further, as shown in FIG. 12B, the image generation unit 30 generates a high-frequency component image from a difference between the input image and the blurred image. As shown in FIG. 12B, in the high-frequency component image, the difference becomes particularly large in the region where a gradation difference is large.

Figure 12C:
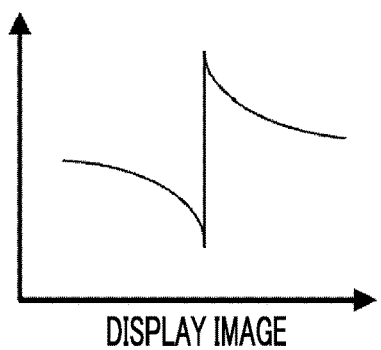
FIG. 12C is a diagram following FIG. 12B for describing an example of high-frequency component emphasis processing.

Furthermore, as shown in FIG. 12C, the image generation unit 30 adds the high-frequency component image to the input image according to a weight W to generate a display image in which the high-frequency component is emphasized. That is, the display image is in a state in which the image quality is deteriorated as compared with the input image.

Figure 13:
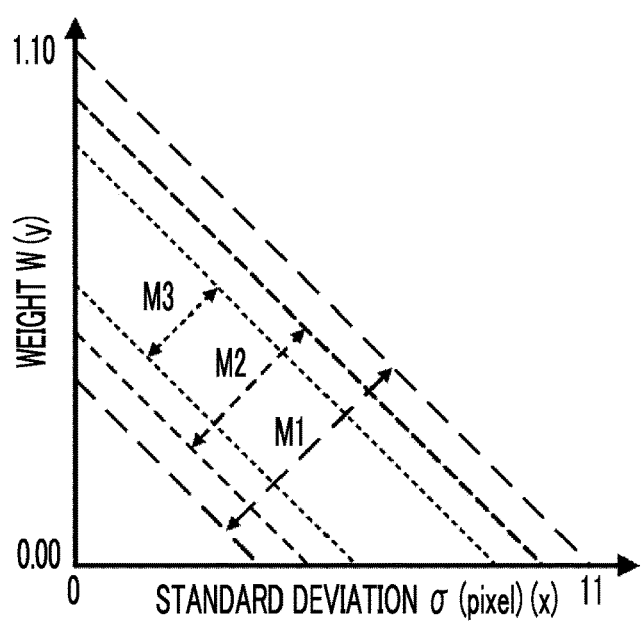
FIG. 13 is a graph for describing a preferable range of unsharp masking executed by an image generation unit controller of the image display device of the first embodiment.

In a case where the resolution of the image display device 12 is 325 ppi (pixel per inch), in the unsharp masking to be applied to the input image, the range of the unsharp mask to be applied is preferably a range M1 represented by the following expression (2), more preferably a range M2 represented by the following expression (3), and still more preferably a range M3 represented by the following expression (4) in a case where the standard deviation σ is denoted by x and the weight W is denoted by y, as shown in FIG. 13.

$$-0.1 \times x + 0.40 < y < -0.1 \times x + 1.10 \qquad (2)$$

$$-0.1 \times x + 0.50 < y < -0.1 \times x + 1.00 \qquad (3)$$

$$-0.1 \times x + 0.60 < y < -0.1 \times x + 0.90 \qquad (4)$$

In a case where the resolution of the image display device 12 is X ppi, an unsharp mask corresponding to a range obtained by multiplying the standard deviation σ of the above expressions (2) to (4) by the number obtained by dividing X by 325 may be applied. Specifically, an unsharp mask corresponding to the ranges M1 to M3 represented by each of the following expressions (5) to (7) may be applied.

$$-0.1 \times x \times (X \div 325) + 0.40 < y < -0.1 \times x \times (X \div 325) + 1.10 \qquad (5)$$

$$-0.1 \times x \times (X \div 325) + 0.50 < y < -0.1 \times x \times (X \div 325) + 1.00 \qquad (6)$$

$$-0.1 \times x \times (X \div 325) + 0.60 < y < -0.1 \times x \times (X \div 325) + 0.90 \qquad (7)$$

[Operation of Controller 31]

Next, an operation of the controller 31 of the image display device 12 of the present embodiment will be described.

As described above, in the image exposure device 10 of the present embodiment, the divided exposure that enables exposure of a recorded image having more gradations than the maximum gradation number of the display unit 32 is performed by displaying a display image for divided exposure having a divided gradation value a plurality of times on the display unit 32 and exposing the photosensitive recording medium 14 a plurality of times. The number of exposures, the exposure time, and the divided gradation value in the divided exposure will be described.

First, the number of exposures in the divided exposure (hereinafter simply referred to as "the number of exposures") will be described. The number of exposures is determined according to the number of gradations of the recorded image and the maximum gradation number of the display unit 32. As an example, in the present embodiment, the number of exposures in a case where the number of gradations of the recorded image is X gradations and the maximum gradation number of the display unit 32 is Y gradations is an integer rounded up to the first decimal point of the value obtained by dividing X by Y (X/Y). For example, in a case where the gradation number X=1024 of the recorded image and the maximum gradation number Y=256 of the display unit 32 are set, the solution obtained by dividing 1024 (gradation) by 256 (gradation) is 4.0 (1024÷256=4.0), so that the number of exposures is four.

Next, the exposure time of each exposure in the divided exposure (hereinafter referred to as a "divided exposure time") will be described. In the image exposure device 10 of the present embodiment, the divided exposure times are the same. Although the exposure time of each exposure may be different, it is preferable that the exposure time of each exposure is the same as in the present embodiment because a reciprocal irregularity may occur depending on the exposure time. Therefore, in the present embodiment, the value obtained by dividing an exposure time predetermined as an exposure time during which a recorded image having the maximum gradation number can be recorded on the photosensitive recording medium 14 by the display image having the maximum gradation number of the display unit 32 (hereinafter referred to as an "appropriate exposure time") by the number of exposures is defined as the divided exposure time. For example, in a case where the maximum gradation number of the display unit 32 is 256 gradations, the appropriate exposure time is 100 msec, and four exposures are performed, the solution obtained by dividing 100 (msec) by 4 (times) is 25 (100/4=25), so that the divided exposure time is 25 msec.

Moreover, the divided gradation value will be described. The divided gradation value is a value obtained by dividing the gradation value of the recorded image, and in the present embodiment, the divided gradation value of the display image for divided exposure is set for each exposure in the divided exposure. FIG. 14 shows an example of a correspondence of a gradation value of a recorded image, a divided gradation value of a display image for divided exposure used for each exposure in divided exposure, and a total amount of light (total light amount) emitted to the photosensitive recording medium 14. Note that FIG. 14 shows an example in which the number of gradations of the recorded image is 1024 gradations, the maximum gradation number of the display unit 32 is 256 gradations, the number of exposures is four, and the divided exposure time is 25 msec. FIG. 15 shows an example of a correspondence of a gradation value of a recorded image of 256 gradations, a gradation value of a display image, and an amount of light emitted to a photosensitive recording medium 14 in a case where the recorded image is recorded on the photosensitive recording medium 14 with one exposure without performing the divided exposure. Note that FIG. 15 shows an example in which the appropriate exposure time is 100 msec because the divided exposure is not performed. The total amount of light in FIG. 14 and the amount of light in FIG. 15 show relative values in a case where the amount of light emitted to the photosensitive recording medium 14 is set to "100" in order to record the recorded image having the gradation value "1" on the photosensitive recording medium 14 without performing the divided exposure.

As shown in FIG. 15, in a case where the divided exposure is not performed and the gradation value of the recorded image is "1", by performing the exposure with the gradation value of the display image set to "1", the total amount of light emitted to the photosensitive recording medium 14 becomes "100".

On the other hand, as shown in FIG. 14, in a case where the divided exposure is performed and the gradation value of the recorded image is "1", in the first exposure, the divided gradation value of the display image for divided exposure is set to "1", in the second exposure, the divided gradation value of the display image for divided exposure is set to "0", and in the third exposure, the divided gradation value of display image for divided exposure is set to "0". Further, in the fourth exposure, it is shown that the divided gradation value of the display image for divided exposure is set to "0". By performing four exposures with these display images for divided exposure, the total amount of light emitted to the photosensitive recording medium 14 becomes "25". In this way, even if the gradation value of the recorded image is the same "1", the amount of light emitted to the photosensitive recording medium 14 is different between the case where the divided exposure is performed and the case where the divided exposure is not performed.

Further, in a case where the divided exposure is not performed, in the divided exposure in the case where the amount of light "100" emitted to the photosensitive recording medium 14 becomes the total amount of light emitted to the photosensitive recording medium 14 in order to set the gradation value of the recorded image to "1", the gradation value of the recorded image becomes "4" as shown in FIG. 14. In this case, as shown in FIG. 14, in the first exposure in the divided exposure, the divided gradation value of the display image for divided exposure is set to "1", in the second exposure, the divided gradation value of the display image for divided exposure is set to "1", and in the third exposure, the divided gradation value of display image for divided exposure is set to "1". Further, in the fourth exposure, the divided gradation value of the display image for divided exposure is set to "1". In this way, even if the amount of light emitted to the photosensitive recording medium 14 is the same, the gradation value of the recorded image recorded on the photosensitive recording medium 14 is different between the case where the divided exposure is performed and the case where the divided exposure is not performed.

As can be seen by comparing FIGS. 14 and 15, according to the image exposure device 10 of the present embodiment, since the amount of the light (total amount of light) emitted to the photosensitive recording medium 14 can be set in detail, the recorded image can be a multi-gradation image.

The divided gradation value of the display image for divided exposure at each time of divided exposure is not limited to the example shown in FIG. 14. For example, in a case where the gradation value of the recorded image is "10", in the first exposure, the divided gradation value of the display image for divided exposure is set to "4", in the second exposure, the divided gradation value of the display image for divided exposure is set to "3", and in the third exposure, the divided gradation value of display image for divided exposure is set to "2". Further, in the fourth exposure, the divided gradation value of the display image for divided exposure may be set to "1".

Further, in the image exposure device 10 of the present embodiment, as shown in FIG. 14, the difference between the gradation value of the display image for divided exposure used for the n-th (n=1 to 3 in FIG. 14) exposure and the gradation value of the display image for divided exposure used for the n+1-th exposure is set to 1. This difference between the gradation values may be different from that of the present embodiment, but in the photosensitive recording medium 14, in order to avoid so-called high-illuminance reciprocal irregularities and low-illuminance reciprocal irregularities, in which the exposure intensity is too high or the exposure intensity is too small and the sensitivity changes, and to facilitate adjustment of the exposure amount and the like after grasping the y value of the display unit 32 of the image display device 12, it is preferably set to 1 as in the present embodiment, or −1 in the case different from the present embodiment.

As an example, in the image display device 12 of the present embodiment, the divided exposure time, the number of exposures, and the correspondence shown in FIG. 14 are stored in advance in the storage unit 46.

[Exposure Processing]

Figure 16:
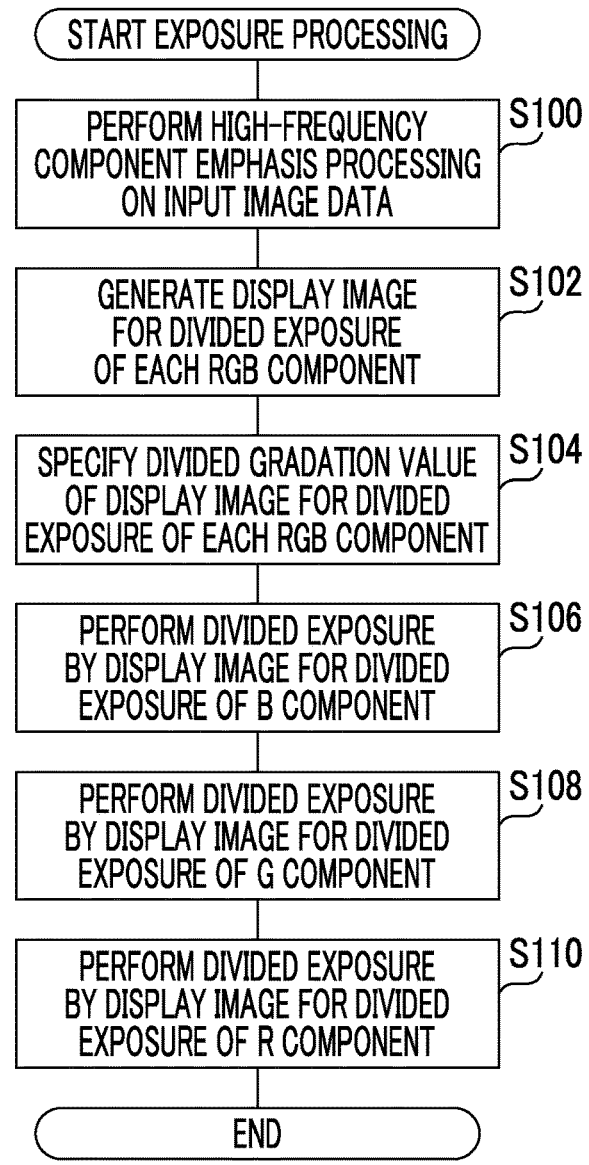
FIG. 16 is a flowchart of an example of exposure processing executed by the image display device of the first embodiment.

Next, exposure processing executed by the image display device 12 of the present embodiment will be described. FIG. 16 shows a flowchart of an example of exposure processing executed by the image display device 12 of the present embodiment. The exposure processing shown in FIG. 16 is executed in a case where the CPU 40 executes the exposure processing program 50.

In Step S100 shown in FIG. 16, as described above, the image generation unit 30 performs, on the input image data, high-frequency component emphasis processing for emphasizing the density difference of the high-frequency component of the input image, and generates a display image for divided exposure in which the high-frequency component is emphasized.

In the next Step S102, the controller 31 generates a display image for divided exposure of the R component, a display image for divided exposure of the G component, and a display image for divided exposure of the B component from the display image for divided exposure to which high-frequency component emphasis processing has been performed by the processing of Step S100. As an example, in the image processing using NumPy of the Python language, the controller 31 of the present embodiment separates the color channels of the display image for divided exposure to generate a display image for divided exposure (single color image) of each RGB component. The method by which the controller 31 generates a display image for divided exposure of each RGB component from the display image for divided exposure is not limited to this method, and a known technique can be applied.

In the next Step S104, as described above, the controller 31 refers to the correspondence shown in FIG. 14 and specifies the divided gradation value for each divided exposure of the display image for divided exposure of each RGB component. For example, in a case where the gradation value of R is "7" for a certain pixel 13 having the display unit 32, regarding the display image for divided exposure of the R component, the divided gradation value in the first exposure of the pixel 13 specified as "2", the divided gradation value in the second exposure thereof is specified as "2", and the divided gradation value in the third exposure thereof is specified as "2". Further, the divided gradation value in the fourth exposure thereof is specified as "1".

Figure 17:
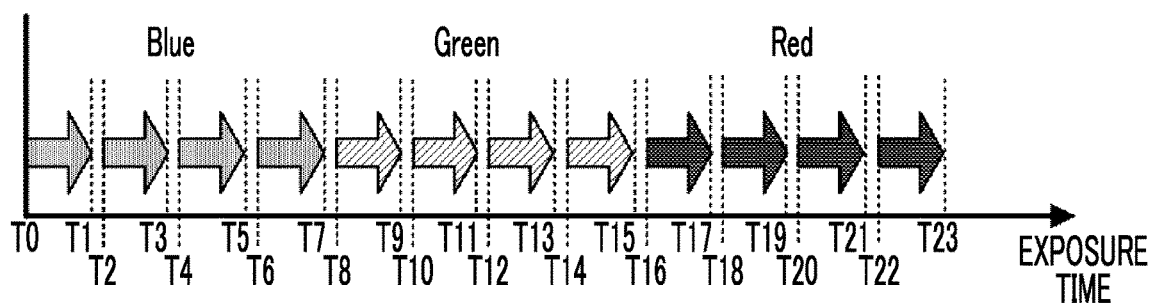
FIG. 17 is a time chart showing an example of divided exposure of the first embodiment.

In the next Step S106, as shown in FIG. 17, the controller 31 performs the divided exposure by the display image for divided exposure of the B component according to the divided gradation value specified in the Step S104. In the next Step S108, as shown in FIG. 17, the controller 31 performs the divided exposure by the display image for divided exposure of the G component according to the divided gradation value specified in the Step S104. In the next Step S110, as shown in FIG. 17, the controller 31 performs the divided exposure by the display image for divided exposure of the R component according to the divided gradation value specified in the Step S104.

In this way, in the exposure processing of the present embodiment, the divided exposure and the RGB sequential exposure are performed. In the example shown in FIG. 17, in a case where an exposure start time T0 is reached, the controller 31 displays (turns on) the display image for divided exposure of the B component on the display unit 32 with the amount of light corresponding to the divided gradation value in the first exposure. During the period from time T1 to time T2, the controller 31 switches the amount of light of the display image for divided exposure of the B component from the amount of light corresponding to the divided gradation value in the first exposure to the amount of light corresponding to the divided gradation value in the second exposure. In a case where the gradation of the display image for divided exposure is different between the first time and the second time, by switching the display image for divided exposure, the controller 31 switches the amount of light of the display image for divided exposure of the B component from the amount of light corresponding to the divided gradation value in the first exposure to the amount of light corresponding to the divided gradation value in the second exposure.

In a case where the divided gradation value in the first exposure and the divided gradation value in the second divided exposure are the same, in other words, in a case where the gradation of the display image for divided exposure is the same for the first time and the second time, the controller 31 may continue to display the display image being displayed as the second display image as it is without switching the display image for divided exposure. In this case, time T1=time T2 is achieved because it is not necessary to provide a time for switching the display image for divided exposure.

In a case where time T2 is reached, the controller 31 displays (turns on) the display image for divided exposure of the B component on the display unit 32 with the amount of light corresponding to the divided gradation value in the second exposure. Similarly, during the period from time T3 to time T4, the controller 31 switches the amount of light of the display image for divided exposure of the B component from the amount of light corresponding to the divided gradation value in the second exposure to the amount of light corresponding to the divided gradation value in the third exposure. As described above, in a case where the divided gradation value in the second exposure and the divided gradation value in the third divided exposure are the same, the controller 31 may continue to display the display image being displayed as the third display image as it is without switching the display image for divided exposure. In this case, time T3=time T4 is achieved because it is not necessary to provide a time for switching the display image for divided exposure.

In a case where time T4 is reached, the controller 31 displays (turns on) the display image for divided exposure of the B component on the display unit 32 with the amount of light corresponding to the divided gradation value in the third exposure. Further, during the period from time T5 to time T6, the controller 31 switches the amount of light of the display image for divided exposure of the B component from the amount of light corresponding to the divided gradation value in the third exposure to the amount of light corresponding to the divided gradation value in the fourth exposure. As described above, in a case where the divided gradation value in the third exposure and the divided gradation value in the fourth divided exposure are the same, the controller 31 may continue to display the display image being displayed as the fourth display image as it is without switching the display image for divided exposure. In this case, time T5=time T6 is achieved because it is not necessary to provide a time for switching the display image for divided exposure.

In a case where time T6 is reached, the controller 31 displays (turns on) the display image for divided exposure of the B component on the display unit 32 with the amount of light corresponding to the divided gradation value in the fourth exposure. Thereafter, in a case where time T7 is reached, the controller 31 hides (turns off) the display image for divided exposure of the B component. In this way, the controller 31 sequentially turns on the sub-pixels 13B of the pixel 13 with the amount of light corresponding to the divided gradation value during time T0 to time T7, and exposes the photosensitive recording medium 14 four times with the display image for divided exposure of the B component.

Further, the controller 31 switches the image to be displayed on the display unit 32 from the display image for divided exposure of the B component to the display image for divided exposure of the G component during the period from time T7 to time T8, and in a case where time T8 is reached, the controller 31 displays (turns on) the display image for divided exposure of the G component on the display unit 32 with the amount of light corresponding to the divided gradation value in the first exposure. The display of the display image for divided exposure of the G component is also controlled by the controller 31 in the same manner as in the case of the B component described above. Specifically, during the period from time T9 to time T10, the controller 31 switches the amount of light of the display image for divided exposure of the G component from the amount of light corresponding to the divided gradation value in the first exposure to the amount of light corresponding to the divided gradation value in the second exposure. As described above, in a case where the divided gradation value in the first exposure and the divided gradation value in the second divided exposure are the same, the controller 31 may continue to display the display image being displayed as the second display image as it is without switching the display image for divided exposure. In this case, time T9=time T10 is achieved because it is not necessary to provide a time for switching the display image for divided exposure.

In a case where time T10 is reached, the controller 31 displays (turns on) the display image for divided exposure of the G component on the display unit 32 with the amount of light corresponding to the divided gradation value in the second exposure. Similarly, during the period from time T11 to time T12, the controller 31 switches the amount of light of the display image for divided exposure of the G component from the amount of light corresponding to the divided gradation value in the second exposure to the amount of light corresponding to the divided gradation value in the third exposure. As described above, in a case where the divided gradation value in the second exposure and the divided gradation value in the third divided exposure are the same, the controller 31 may continue to display the display image being displayed as the third display image as it is without switching the display image for divided exposure. In this case, time T11=time T12 is achieved because it is not necessary to provide a time for switching the display image for divided exposure.

In a case where time T12 is reached, the controller 31 displays (turns on) the display image for divided exposure of the G component on the display unit 32 with the amount of light corresponding to the divided gradation value in the third exposure. Further, during the period from time T13 to time T14, the controller 31 switches the amount of light of the display image for divided exposure of the G component from the amount of light corresponding to the divided gradation value in the third exposure to the amount of light corresponding to the divided gradation value in the fourth exposure. As described above, in a case where the divided gradation value in the third exposure and the divided gradation value in the fourth divided exposure are the same, the controller 31 may continue to display the display image being displayed as the fourth display image as it is without switching the display image for divided exposure. In this case, time T13=time T14 is achieved because it is not necessary to provide a time for switching the display image for divided exposure.

In a case where time T14 is reached, the controller 31 displays (turns on) the display image for divided exposure of the G component on the display unit 32 with the amount of light corresponding to the divided gradation value in the fourth exposure. Thereafter, in a case where time T15 is reached, the controller 31 hides (turns off) the display image for divided exposure of the G component. Specifically, the controller 31 sequentially turns on the sub-pixels 13G of the pixel 13 with the amount of light corresponding to the divided gradation value during time T8 to time T15, and exposes the photosensitive recording medium 14 four times with the display image for divided exposure of the G component.

Further, the controller 31 switches the image to be displayed on the display unit 32 from the display image for divided exposure of the G component to the display image for divided exposure of the R component during the period from time T15 to time T16, and in a case where time T16 is reached, the controller 31 displays (turns on) the display image for divided exposure of the R component on the display unit 32 with the amount of light corresponding to the divided gradation value in the first exposure. The display of the display image for divided exposure of the R component is also controlled by the controller 31 in the same manner as in the case of the B component described above. Specifically, during the period from time T17 to time T18, the controller 31 switches the amount of light of the display image for divided exposure of the R component from the amount of light corresponding to the divided gradation value in the first exposure to the amount of light corresponding to the divided gradation value in the second exposure. As described above, in a case where the divided gradation value in the first exposure and the divided gradation value in the second divided exposure are the same, the controller 31 may continue to display the display image being displayed as the second display image as it is without switching the display image for divided exposure. In this case, time T17=time T18 is achieved because it is not necessary to provide a time for switching the display image for divided exposure.

In a case where time T18 is reached, the controller 31 displays (turns on) the display image for divided exposure of the R component on the display unit 32 with the amount of light corresponding to the divided gradation value in the second exposure. Similarly, during the period from time T19 to time T20, the controller 31 switches the amount of light of the display image for divided exposure of the R component from the amount of light corresponding to the divided gradation value in the second exposure to the amount of light corresponding to the divided gradation value in the third exposure. As described above, in a case where the divided gradation value in the second exposure and the divided gradation value in the third divided exposure are the same, the controller 31 may continue to display the display image being displayed as the third display image as it is without switching the display image for divided exposure. In this case, time T19=time T20 is achieved because it is not necessary to provide a time for switching the display image for divided exposure.

In a case where time T20 is reached, the controller 31 displays (turns on) the display image for divided exposure of the R component on the display unit 32 with the amount of light corresponding to the divided gradation value in the third exposure. Further, during the period from time T21 to time T22, the controller 31 switches the amount of light of the display image for divided exposure of the R component from the amount of light corresponding to the divided gradation value in the third exposure to the amount of light corresponding to the divided gradation value in the fourth exposure. As described above, in a case where the divided gradation value in the third exposure and the divided gradation value in the fourth divided exposure are the same, the controller 31 may continue to display the display image being displayed as the fourth display image as it is without switching the display image for divided exposure. In this case, time T21=time T22 is achieved because it is not necessary to provide a time for switching the display image for divided exposure.

In a case where time T22 is reached, the controller 31 displays (turns on) the display image for divided exposure of the R component on the display unit 32 with the amount of light corresponding to the divided gradation value in the fourth exposure. Thereafter, in a case where time T23 is reached, the controller 31 hides (turns off) the display image for divided exposure of the R component. Specifically, the controller 31 sequentially turns on the sub-pixels 13R of the pixel 13 with the amount of light corresponding to the divided gradation value during time T16 to time T23, and exposes the photosensitive recording medium 14 four times with the display image for divided exposure of the R component.

In a case where the process of Step S110 is completed, the main exposure processing is completed. In the image exposure device 10 of the present embodiment, a recorded image having the same gradation value as the gradation value of the input image is recorded on the photosensitive recording medium 14 by the main exposure processing.

Second Embodiment

In the present embodiment, an example of optimizing the exposure amount of each of RGB in the display image for divided exposure for exposing the photosensitive recording medium 14 will be described. Note that, since the overall configuration of the image exposure device 10, and the configuration of the support portion 21, the photosensitive recording medium 14, and the louver film 16 are the same as those in the first embodiment, the description thereof will be omitted. On the other hand, in the image exposure device 10 of the present embodiment, since the operation of the controller 31 of the image display device 12 is different, the operation of the controller 31 will be described.

[Operation of Controller 31]

The spectral characteristics of the light emitted from the image display device 12 to the photosensitive recording medium 14 may differ from the spectral sensitivity of the photosensitive recording medium 14, specifically, the spectral sensitivity (spectral characteristics) of the sensitive material of the photosensitive recording medium 14. In a case where the spectral characteristics of the image display device 12 and the photosensitive recording medium 14 are different from each other, the tint of the display image displayed on the image display device 12 may differ from the tint of the recorded image recorded on the photosensitive recording medium 14, that is, the tint of the recorded image exposed by the display image. For example, in the image display device 12, an image optimized for the spectral characteristics of the human eye is usually used as a display image. In this way, in a case where the photosensitive recording medium 14 is exposed to the display image optimized for the spectral characteristics of the human eye, the tint of the recorded image recorded on the photosensitive recording medium 14 may differ from the tint of the display image. For example, in a case where the photosensitive recording medium 14 is exposed to a display image having a strong green (G) color tint as the display image, a recorded image whose tint is biased toward the green (G) color can be obtained.

In a case where it is desired to make the tint of the recorded image recorded on the photosensitive recording medium 14 an image having a desired tint such as an image optimized for the spectral characteristics of the human eye, it is necessary to adjust the tint of the display image displayed on the image display device 12 in order to expose the photosensitive recording medium 14. Therefore, in a case where a recorded image whose tint is biased toward the green (G) color is obtained as described above, for example, the controller 31 of the present embodiment performs adjustment so that the amount of green (G) light in the display image (exposure image) displayed on the image display device 12 is reduced.

As an example of a method of adjusting the tint of the display image in the image display device 12 in order to make the tint of the recorded image recorded on the photosensitive recording medium 14 a desired tint, there is a method of changing a gradation assignment value of each color of RGB. The case where the display image has a strong green (G) color tint is the case where the exposure amount of green (G) is larger than the exposure amount of other colors in the exposure of the photosensitive recording medium 14. In a case where the gradation of the image display device 12 is 256 gradations, the controller 31 changes, for example, a gradation assignment value in which the pixel value for green (G) is 200 in the image data representing the input image to 150. That is, in a case where the pixel value for the green (G) color in the input image is "200", the controller 31 adjusts the pixel value to "150". By reducing the gradation assignment value, that is, the pixel value in the display image in this way, the exposure amount of green (G) is reduced, and it is possible to obtain a recorded image whose tint is not biased toward the green (G) color.

That is, by adjusting the gradation assignment value of the color having a strong tint to be small, in other words, by adjusting the pixel value of the color having a strong tint to be small, the exposure amount is reduced, so that it is possible to suppress the bias of the tint in the recorded image.

However, in the case of this adjustment method, originally, the gradation from 0 to 255 is assigned to the gradation less than 0 to 255. That is, it means that the number of gradations in the recorded image is less than 255 gradations. Therefore, so-called gradation skipping, tone jumps, and the like may occur in the recorded image.

Figure 18:
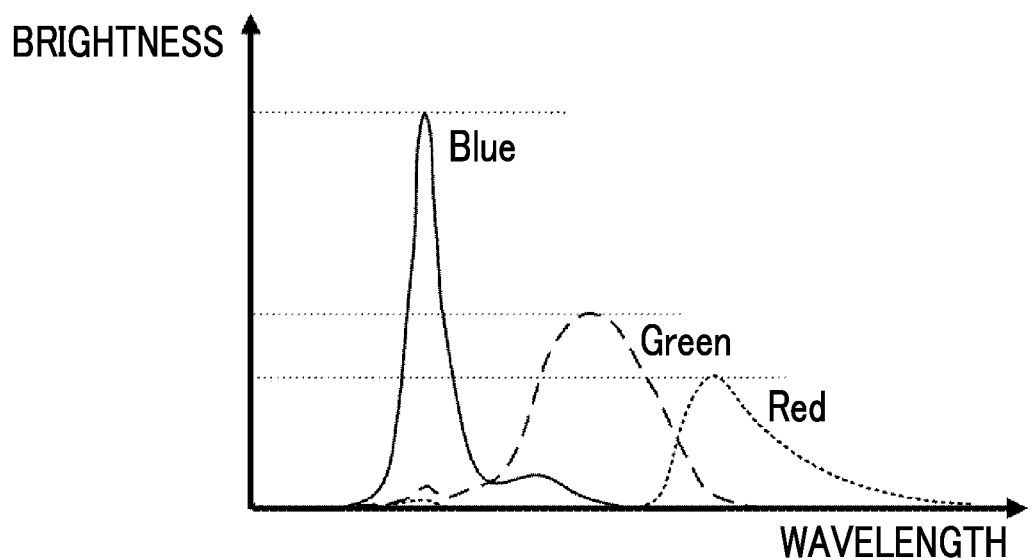
FIG. 18 is a graph showing an example of spectral characteristics of any image display device.
Figure 19:
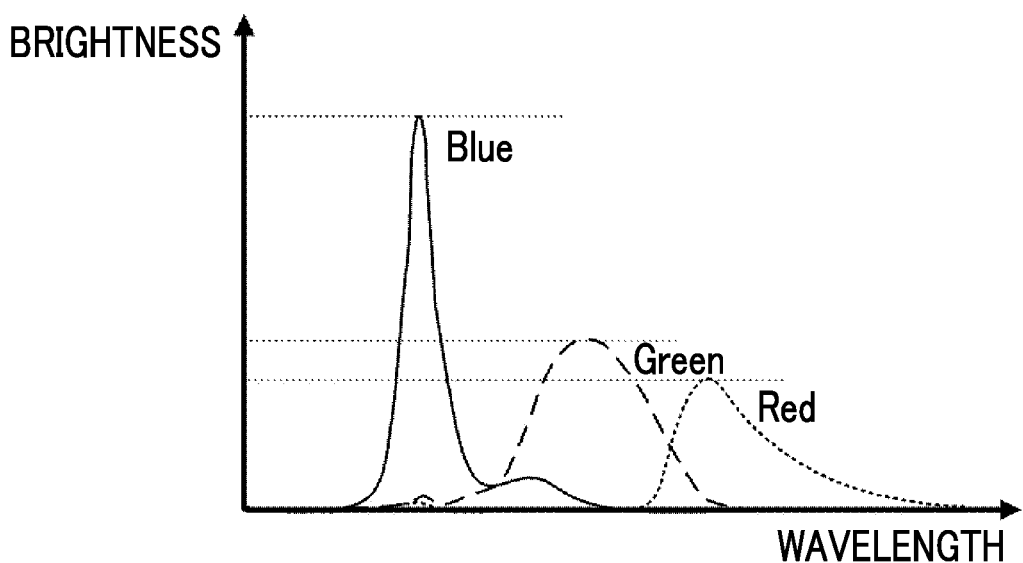
FIG. 19 is a graph showing an example of spectral characteristics of an image display device adjusted to optimize the tint of a recorded image recorded on any photosensitive recording medium.

A more specific description will be given with reference to FIGS. 18 and 19. FIG. 18 shows an example of the spectral characteristics of any image display device 12. On the other hand, FIG. 19 shows an example of spectral characteristics of the image display device 12 adjusted to optimize the tint of the recorded image recorded on any photosensitive recording medium 14. In the example shown in FIG. 19, as described above, since the tint of the green (G) color is strong in the recorded image, the case where the gradation assignment value of the green (G) color is adjusted is shown. As can be seen by comparing FIGS. 18 and 19, the ratio of the brightness of the green (G) color to the blue (B) color is different, and in the adjusted image display device 12 shown in FIG. 19, the ratio of the brightness of the green (G) color to the blue (B) color is small.

For each of the red (R) color, the green (G) color, and the blue (B) color in the spectral characteristics shown in FIG. 18, 256 gradations are assigned to the maximum values of 0 to brightness. In the adjusted spectral characteristics shown in FIG. 19, since the maximum value of the brightness of the green (G) color is smaller than that before the adjustment, the gradation value that can be used is smaller than 255. For example, in a case where the gradation assignment to the maximum value of the brightness of the green (G) color in the adjusted spectral characteristics shown in FIG. 19 is 230, in the adjusted image display device 12, the gradations of 231 to 255 cannot be used for the green (G) color.

As described above, in a case where the spectral characteristics of the image display device 12 and the spectral sensitivity of the photosensitive recording medium 14 are different from each other, the exposure amount of each of RGB in the display image for exposing the photosensitive recording medium 14 is not optimized, so that the number of gradations may decrease.

Therefore, the controller 31 of the present embodiment suppresses the decrease in the number of gradations as described above by optimizing the exposure amount of each of RGB in the display image for exposing the photosensitive recording medium 14. Specifically, the controller 31 optimizes the divided exposure time of each of RGB in the display image for divided exposure, sequentially displays the display image for divided exposure of the R component, the display image for divided exposure of the G component, and the display image for divided exposure of the B component on the image display device 12 in any order, and performs the divided exposure to optimize the exposure amount of each of RGB.

(Optimization Method of Divided Exposure Time)

Figure 20:
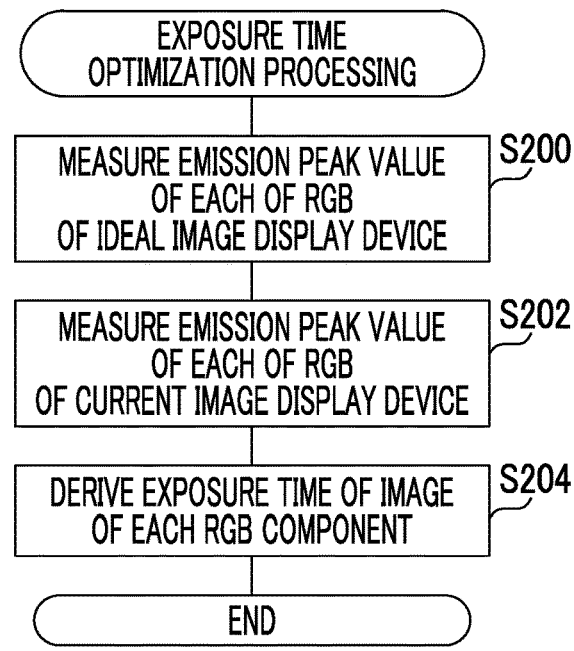
FIG. 20 is a flowchart showing an example of a flow of exposure time optimization processing for optimizing an exposure time.
Figure 21:
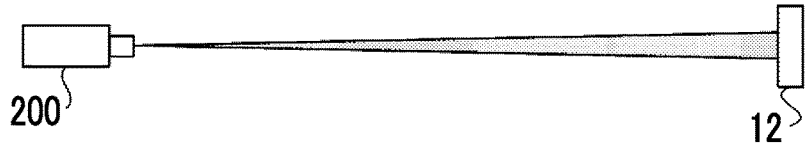
FIG. 21 is a diagram showing an example of an evaluation system for spectral characteristics (brightness) used in optimizing an exposure time.

FIG. 20 is a flowchart showing an example of a flow of exposure time optimization processing for optimizing an exposure time. Further, FIG. 21 shows an example of an evaluation system for spectral characteristics (brightness) used in optimizing an exposure time. In the evaluation system shown in FIG. 21, a spectroradiometer "SR-3" manufactured by Topcon Technohouse Co., Ltd. is used as a spectroradiometer 200, and the distance is 50 cm and the measurement angle is 2 degrees.

First, as a preprocessing step, in Step S200 shown in FIG. 20, an emission peak value of each of RGB of an ideal image display device is measured. An ideal image display device is an image display device that displays a display image that matches the tint of the recorded image recorded on the photosensitive recording medium 14. That is, the image display device is the image display device 12 in a state where the display image is optimized.

Specifically, a display image for divided exposure of the R component, that is, an image of red (R) color having a pixel value of (255,0,0) is displayed on an ideal image display device, and an emission peak value is measured by the evaluation system shown in FIG. 21. Similarly, a display image for divided exposure of the G component, that is, an image of green (G) color having a pixel value of (0,255,0) is displayed on an ideal image display device, and an emission peak value is measured by the evaluation system shown in FIG. 21. In addition, similarly, a display image for divided exposure of the B component, that is, an image of blue (B) color having a pixel value of (0,0,255) is displayed on an ideal image display device, and an emission peak value is measured by the evaluation system shown in FIG. 21. Thereby, the maximum value (maximum amount of light) of the optimum brightness in each of red (R), green (G), and blue (B) can be obtained.

Next, as a post-processing step, in Step S202 shown in FIG. 20, the emission peak value of each of RGB of the current image display device 12 before being incorporated into the image exposure device 10 is measured. As an example, in the present embodiment, the emission peak value of each of RGB in the image display device 12 before the louver film 16 is provided is measured. As for the measurement method, the image of the R component (255, 0,0), the image of the G component (0,255,0), and the image of the B component (0,0,255) are sequentially displayed on the image display device 12 in the same manner as in Step S100 described above, and the emission peak value in each image is measured by the spectroradiometer 200. Thereby, the maximum value (maximum amount of light) of the optimum brightness in the current image exposure device 10 in each of red (R), green (G), and blue (B) can be obtained.

As a post-processing step at the end of exposure time optimization processing, in Step S204 shown in FIG. 20, the exposure time of the display image for divided exposure of each RGB component is derived. The total amount of light that hits the photosensitive recording medium 14 in exposure is the amount obtained by multiplying each amount of light for each of RGB and the exposure time (light amount× exposure time). As an example, in the present embodiment, the amount of light exposed for 100 msec at the maximum value of the brightness in the ideal image display device measured in Step S200 is defined as the total amount of light. That is, for each of RGB, the total amount of light for each of RGB is obtained by multiplying the maximum value (maximum amount of light) of the brightness measured in Step S200 by 100 msec. Next, for each of RGB, the optimum exposure time of each of RGB is obtained by dividing each total amount of light by the maximum value (maximum amount of light) of the brightness in the image display device 12 measured in Step S202 (total amount of light÷maximum amount of light). As an example, in the present embodiment, the optimum exposure time for each of the RGB thus obtained is stored in advance in the storage unit 46 of the image display device 12. The exposure time optimized by the main exposure time optimization processing is an appropriate exposure time. Therefore, the value obtained by dividing the exposure time optimized by the main exposure time optimization processing by the number of exposures is an optimized divided exposure time.

The method of optimizing the exposure time for each of RGB is not limited to the above-mentioned method. For example, in a case where a white image (255, 255, 255) is displayed as a display image on the image exposure device 10 and the photosensitive recording medium 14 is exposed by the present display image, the maximum value of the brightness of the display image (display image for divided exposure) for obtaining the optimum recorded image may be specified by adjusting the tint of the display image so that the recorded image is optimized.

Further, in the present embodiment, the color adjustment of each gradation was performed using a three-dimensional LookUp table (LUT) that refers to the combination of the output values of each of R, G, and B for the combination of the input values of each of R, G, and B.

Figure 22:
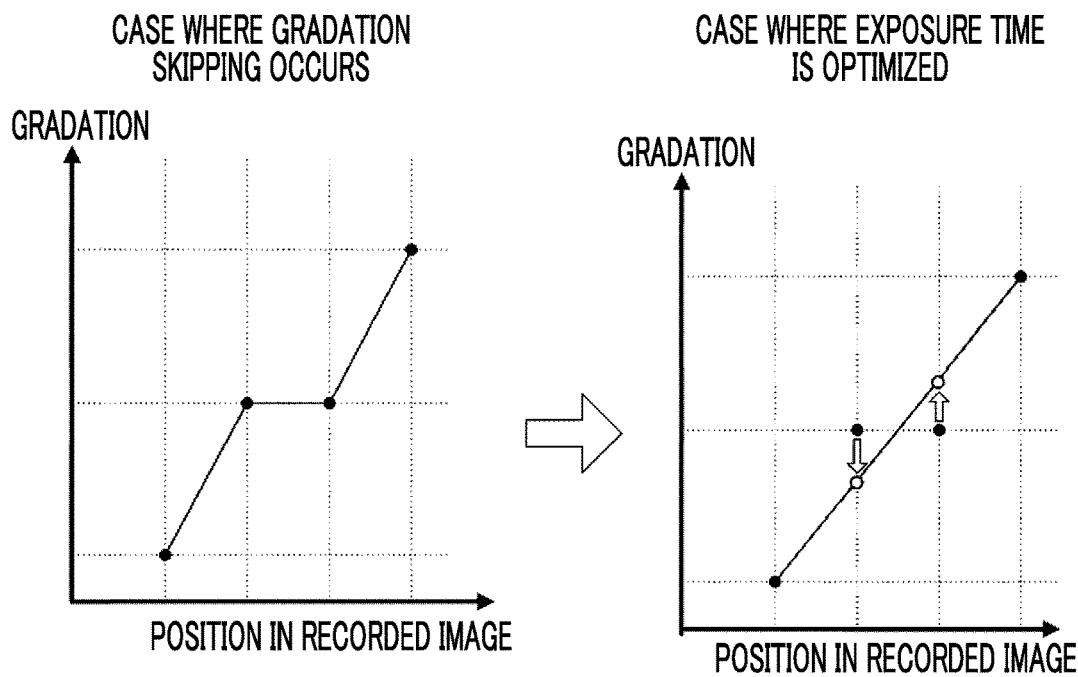
FIG. 22 is a diagram for describing blurring that occurs in a recorded image in a case where an exposure time is optimized.

In this way, in the image exposure device 10 of the present embodiment, in a case where the controller 31 performs divided exposure by RGB sequential exposure at the optimized exposure time, the number of gradations of the display image for divided exposure does not decrease and the gradation skipping is reduced. Therefore, in the image exposure device 10 of the present embodiment, the display image for divided exposure becomes a smooth image. However, by reducing the gradation skipping, the change in color shading is reduced, and as a result, the recorded image may become a blurred image. For example, as shown in FIG. 22, in a case where the exposure time is optimized as compared with the case where gradation skipping occurs as described above, the recorded image has more gradations indicated by white circles in the graph. However, as shown in FIG. 22, in the recorded image in which the exposure time is optimized, the image tends to be a blurred image with reduced visibility of the edge portion.

Therefore, in the present embodiment, the image generation unit 30 of the image display device 12 performs image processing to increase (emphasis) the high-frequency component (edge portion) of the display image in advance in consideration of the fact that the density difference is reduced in the recorded image rather than in the display image. In particular, the image generation unit 30 performs image processing for increasing (emphasizing) the high-frequency component (edge portion) of the display image in advance in consideration of the fact that the display image becomes the blurred image due to the optimization of the exposure time.

[Exposure Processing]

Figure 23:
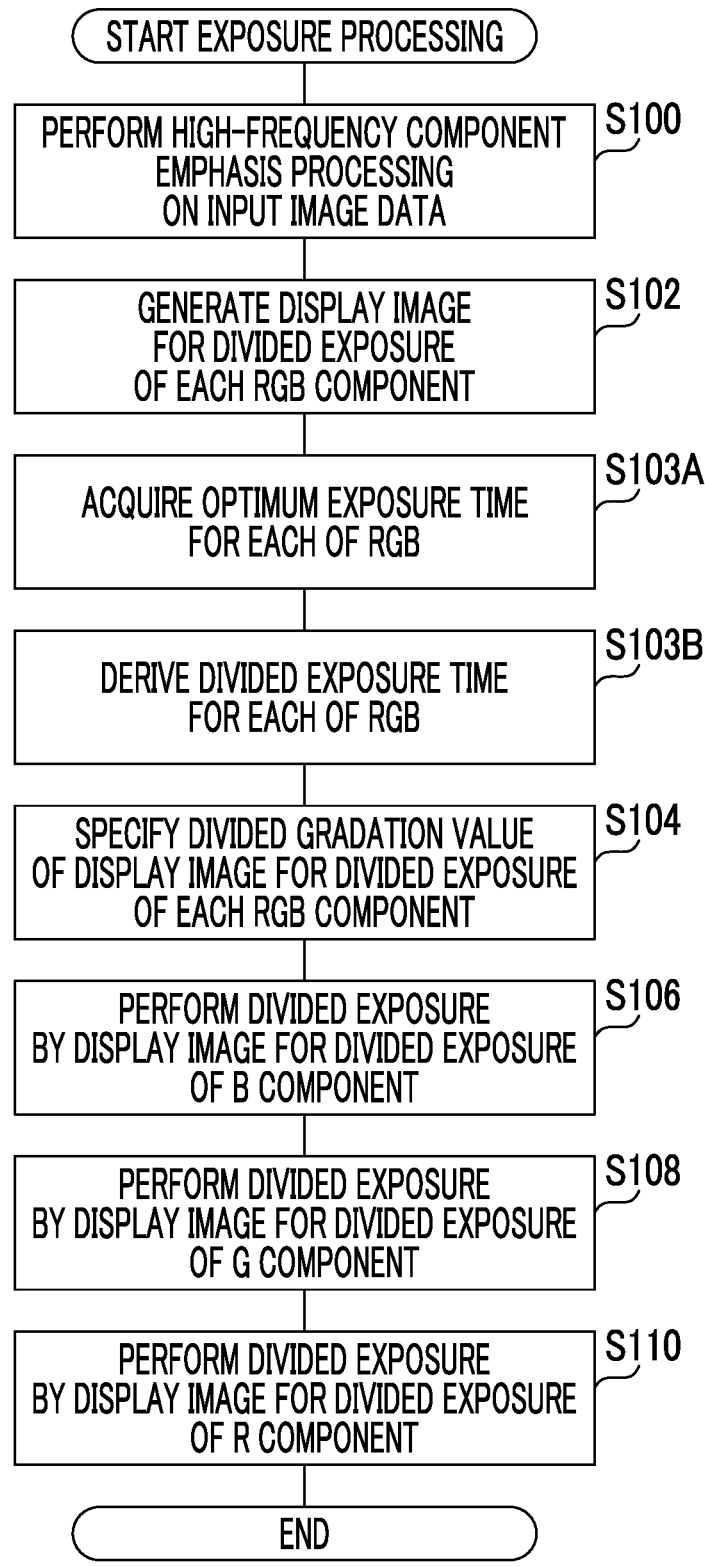
FIG. 23 is a flowchart of an example of exposure processing executed by an image display device of a second embodiment.

Next, exposure processing executed by the image display device 12 of the present embodiment will be described. FIG. 23 shows a flowchart of an example of exposure processing executed by the image display device 12 of the present embodiment. The exposure processing shown in FIG. 23 is different from the exposure processing of the first embodiment (see FIG. 16) in that the processes of Steps S103A and S103B are further provided between Steps S102 and S104.

In the exposure processing shown in FIG. 23, in Step S103A, the controller 31 acquires the optimum exposure time for each of RGB from the storage unit 46 as described above. In the next Step S103B, the controller 31 derives the divided exposure time for each of RGB. Specifically, the controller 31 derives the divided exposure time for each of RGB by dividing the optimum exposure time of each of RGB acquired in Step S103A by the number of exposures.

Figure 24:
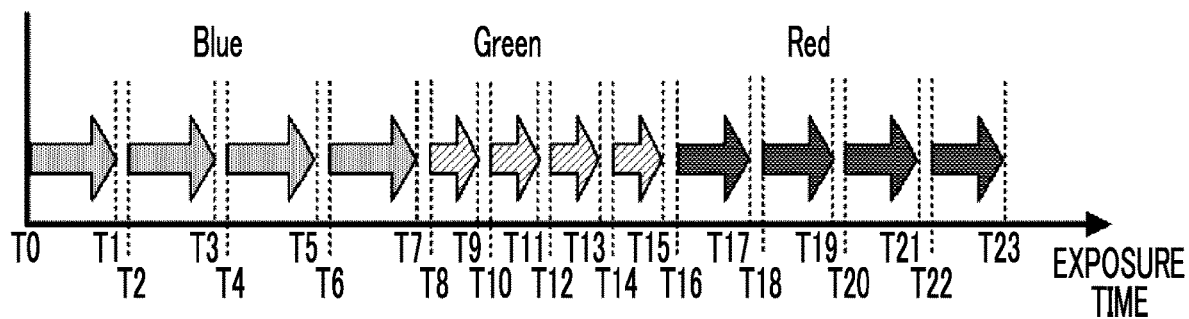
FIG. 24 is a time chart showing an example of divided exposure of the second embodiment.

By the process of the above Step S103B, in the subsequent steps S106 to S108, for example, as in the example shown in the time chart of FIG. 24, the controller 31 displays each of a display image for divided exposure of the R component, a display image for divided exposure of the G component, and a display image for divided exposure of the B component according to the optimum exposure time, and performs RGB sequential exposure and divided exposure.

In this way, according to the image exposure device 10 of the present embodiment, in order to optimize the divided exposure time of the display image for divided exposure of each RGB component, as described above, gradation skipping of the display image for divided exposure is reduced, and the display image for divided exposure can be a smooth image. Therefore, according to the image exposure device 10 of the present embodiment, the tint of the recorded image can be set to a desired tint.

As described above, the image exposure device 10 of each of the above embodiments comprises an image display device 12 having a plurality of pixels 13, a support portion 21 that supports a photosensitive recording medium 14 for recording an image displayed on the image display device 12 in a state in which an exposure surface 14A of the photosensitive recording medium 14 faces the image display device 12, a louver film 16 that is provided between the image display device 12 and the support portion 21 and limits an angle of light radiated from the image display device 12 to the photosensitive recording medium 14, a CPU 40 as at least one processor, and a storage unit 46 that stores an exposure processing program 50 that can be executed by the processor. Further, the CPU 40 provided in the image display device 12 of the image exposure device 10 causes a display unit 32 of the image display device 12 to display a display image for divided exposure, which has a divided gradation value obtained by dividing a gradation value of a recorded image, and sequentially performs a plurality of exposures of the photosensitive recording medium 14 by the display image for divided exposure to perform a divided exposure for recording the recorded image on the photosensitive recording medium 14.

The number of gradations of the recorded image recorded on the photosensitive recording medium 14 depends on the maximum gradation number of the display unit 32 of the image display device 12. Therefore, in a case where the divided exposure is not performed, the number of gradations of the recorded image is the maximum gradation number of the display unit 32. On the other hand, in the image exposure device 10 of each of the above embodiments, in a case where the number of gradations of the desired recorded image is larger than the maximum gradation number, for example, the number of gradations of the input image is larger than the maximum gradation number, the divided exposure is performed by the display image for divided exposure having the divided gradation value obtained by dividing the gradation value of the recorded image by the number of exposures. In this way, in the image exposure device 10 of each of the above embodiments, the amount of light emitted to the photosensitive recording medium 14 can be finely adjusted by increasing the number of exposures.

Therefore, according to the image exposure device 10 of each of the above embodiments, it is possible to record a recorded image having more gradations than the gradation of the display image (display image for divided exposure) displayed on the image display device 12 on the photosensitive recording medium 14.

Further, according to the image exposure device 10 of each of the above embodiments, it is possible to suppress the limitation of the number of gradations of the recorded image due to the maximum gradation of the display image (display image for divided exposure) displayed on the image display device 12. Further, according to the image exposure device 10 of each of the above embodiments, it is possible to use the image display device 12 having the display unit 32 having a relatively small maximum gradation number. Therefore, the image display device 12, and further the image exposure device 10, can be easily configured.

Figure 25:
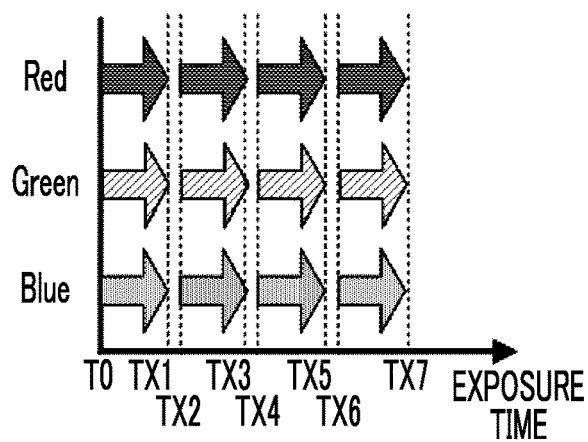
FIG. 25 is a time chart showing a modification example of divided exposure.

In each of the above embodiments, a mode in which RGB sequential exposure is performed has been described, but as shown in an example of the time chart of FIG. 25, a display image for divided exposure of the R component, a display image for divided exposure of the G component, and a display image for divided exposure of the B component may be displayed on the display unit 32 at the same time. That is, RGB batch exposure may be performed.

Further, in each of the above embodiments, the case where the number of gradations of the input image and the recorded image is predetermined has been described, but the number of gradations of at least one of the input image or the recorded image may not be predetermined or may be variable. In this case, the controller 31 may acquire a non-predetermined number of gradations via, for example, the input unit 48 or the like. In this case, the controller 31 derives the number of exposures and the divided exposure time in the divided exposure according to the acquired number of gradations.

Further, in the above embodiments, the case where the number of gradations of the recorded image is larger than the maximum gradation number of the display unit 32 has been described, but the recorded image having a smaller number of gradations than the maximum gradation number of the display unit 32 may be recorded on the photosensitive recording medium 14. In other words, the image exposure device 10 may be an exposure device capable of recording (exposing) two types of recorded images, for example, a recorded image having a larger number of gradations than the maximum gradation number of the display unit 32 and a recorded image having a smaller number of gradations than the maximum gradation number of the display unit 32, on the photosensitive recording medium 14. In a case where the image exposure device 10 is such an exposure device, and a recorded image having a smaller number of gradations than the maximum gradation number of the display unit 32 is recorded on the photosensitive recording medium 14, instead of the divided exposure in which a plurality of exposures are performed, a batch exposure in which the number of exposures is one may be performed.

Further, in each of the above embodiments, a mode in which each of the plurality of pixels 13 of the image display device 12 comprises sub-pixels 13R, 13G, and 13B to display a color image on the image display device 12 has been described, but the configuration of the image display device 12 for displaying the color image is not limited to this mode. For example, the image display device 12 may be provided with a light source or a filter corresponding to each of the R component, the G component, and the B component.

In each of the above embodiments, the aspect in which the unsharp masking is performed as the high-frequency component emphasis processing performed by the image generation unit 30 has been described, but the present disclosure is not limited to the present embodiment, and for example, convolution processing or the like may be applied.

For example, the structure of the louver film 16 is also not limited, and further, it is not limited as long as it is a limiting member capable of limiting the angle of the light emitted from the image display device 12. For example, the light transmission parts 102 and the light shielding parts 104 may be disposed aperiodically, and a capillary plate or the like in which holes are randomly formed may be used as the limiting member.

In addition, in each of the above embodiments, the aspect in which the image display device 12 comprises the image generation unit 30 and the controller 31 has been described, but each of the image generation unit 30 and the controller 31 may be configured as a device different from the image display device 12. For example, a CPU such as a smartphone may execute the exposure processing program 50 to perform image processing by functioning as the image generation unit 30 and the controller 31 and the image display device 12 may receive the image data subjected to the image processing from the smartphone and display a display image corresponding to the image data on the display unit 32. Further, the image generation unit 30 and the controller 31 may be provided in different devices.

Further, as hardware structures of processing units that execute various kinds of processing such as the image generation unit 30 and the controller 31 of the image display device 12 in the present embodiment, various processors shown below can be used. As described above, the various processors include a programmable logic device (PLD) as a processor of which the circuit configuration can be changed after manufacture, such as a field-programmable gate array (FPGA), a dedicated electrical circuit as a processor having a dedicated circuit configuration for executing specific processing such as an application specific integrated circuit (ASIC), and the like, in addition to the CPU as a general-purpose processor that functions as various processing units by executing software (program).

One processing unit may be configured by one of the various processors, or configured by a combination of the same or different kinds of two or more processors (for example, a combination of a plurality of FPGAs or a combination of the CPU and the FPGA). In addition, a plurality of processing units may be configured by one processor.

As an example where a plurality of processing units are configured by one processor, first, there is a form in which one processor is configured by a combination of one or more CPUs and software as typified by a computer, such as a client or a server, and this processor functions as a plurality of processing units. Second, as represented by a system on chip (SoC) or the like, there is a form of using a processor for realizing the function of the entire system including a plurality of processing units with one integrated circuit (IC) chip. In this way, various processing units are configured by one or more of the above-described various processors as hardware structures.

Furthermore, as the hardware structure of the various processors, more specifically, an electrical circuit (circuitry) in which circuit elements such as semiconductor elements are combined can be used.

In the present embodiment, the exposure processing program 50 is described as being stored (installed) in the storage unit 46 in advance; however, the present disclosure is not limited thereto. The exposure processing program 50 may be provided in a form recorded in a recording medium such as a compact disc read only memory (CD-ROM), a digital versatile disc read only memory (DVD-ROM), and a universal serial bus (USB) memory. In addition, the exposure processing program 50 may be downloaded from an external device via a network.

The disclosure of Japanese Patent Application No. 2020-025671 filed Feb. 18, 2020 is incorporated herein by reference in its entirety.

All literatures, patent applications, and technical standards described herein are incorporated by reference to the same extent as if the individual literature, patent applications, and technical standards were specifically and individually stated to be incorporated by reference.

What is claimed is:

1. An image exposure device comprising:
    an image display device having a plurality of pixels;
    a support portion that supports a photosensitive recording medium for recording a display image displayed on the image display device in a state in which an exposure surface of the photosensitive recording medium faces the image display device;
    a limiting member that is provided between the image display device and the support portion and limits an angle of light emitted from the image display device to the photosensitive recording medium;
    at least one processor; and
    a memory that stores instructions that are able to be executed by the processor,
    wherein the processor is configured to
        cause the image display device to display a display image for divided exposure, which has a divided gradation value obtained by dividing a gradation value of a recorded image, and
        sequentially perform a plurality of exposures of the photosensitive recording medium by the display image for divided exposure to perform a divided exposure for recording the recorded image on the photosensitive recording medium,
    wherein a sum of the divided gradation values of the display image for divided exposure used for each exposure in the divided exposure exceeds a maximum gradation number, which is a maximum value of gradations that are able to be displayed on the image display device.

2. The image exposure device according to claim 1, wherein the sum of the divided gradation values is the same as the gradation value of the recorded image.

3. The image exposure device according to claim 1, wherein the number of exposures in the divided exposure is an integer rounded up to a first decimal point of a value obtained by dividing the number of gradations of the recorded image by the maximum gradation number.

4. The image exposure device according to claim 1, wherein an exposure time of each exposure in the divided exposure is the same.

5. The image exposure device according to claim 4, wherein the exposure time of each exposure in the divided exposure is a time obtained by dividing an exposure time during which a recorded image having the maximum gradation number is able to be recorded on the photosensitive recording medium by a display image having the maximum gradation number by the number of exposures.

6. The image exposure device according to claim 1, wherein the processor is configured to
    specify the divided gradation value of the display image for divided exposure used for each exposure in the divided exposure, and
    control an amount of light of the display image for divided exposure according to the specified divided gradation value.

7. The image exposure device according to claim 6, wherein, in the divided exposure, a difference between the divided gradation value of the display image for divided exposure used for an n-th exposure and the divided gradation value of the display image for divided exposure used for an n+1-th exposure is 1 or −1.

8. The image exposure device according to claim 1, wherein
    image data of an input image having the same gradation value as the gradation value of the recorded image is input, and
    the processor is configured to generate the display image for divided exposure from the input image.

9. The image exposure device according to claim 1, wherein the processor is configured to
    generate a display image for divided exposure of an R component, a display image for divided exposure of a G component, and a display image for divided exposure of a B component from a color input image represented by the input image data, and
    sequentially display each of the display image for divided exposure of the R component, the display image for divided exposure of the G component, and the display image for divided exposure of the B component on the image display device in a predetermined order, and perform the divided exposure for each color of RGB.

10. The image exposure device according to claim 9, wherein
a total amount of light for exposing the photosensitive recording medium is determined for each color of RGB, and
the processor is configured to sequentially expose the photosensitive recording medium by each of the display image for divided exposure of the R component, the display image for divided exposure of the G component, and the display image for divided exposure of the B component at an exposure time corresponding to a maximum amount of light of each color of RGB displayed on the image display device and the total amount of light, and perform the divided exposure for each color of RGB.

11. The image exposure device according to claim 1, wherein the processor is configured to generate the display image for divided exposure in which an image quality of an input image represented by the input image data is deteriorated by emphasizing a density difference of a high-frequency component of the input image.

12. The image exposure device according to claim 1, wherein the limiting member is an optical member of a diffusion optical system.

13. An image exposure method in an image exposure device including an image display device having a plurality of pixels, a support portion that supports a photosensitive recording medium for recording a display image displayed on the image display device in a state in which an exposure surface of the photosensitive recording medium faces the image display device, and a limiting member that is provided between the image display device and the support portion and limits an angle of light emitted from the image display device to the photosensitive recording medium, the method causing a computer to execute a process comprising:
causing the image display device to display a display image for divided exposure, which has a divided gradation value obtained by dividing a gradation value of a recorded image; and
sequentially performing a plurality of exposures of the photosensitive recording medium by the display image for divided exposure to perform a divided exposure for recording the recorded image on the photosensitive recording medium,
wherein a sum of the divided gradation values of the display image for divided exposure used for each exposure in the divided exposure exceeds a maximum gradation number, which is a maximum value of gradations that are able to be displayed on the image display device.

14. A non-transitory computer-readable storage medium storing a program for causing a computer to execute a process on an image exposure device including an image display device having a plurality of pixels, a support portion that supports a photosensitive recording medium for recording a display image displayed on the image display device in a state in which an exposure surface of the photosensitive recording medium faces the image display device, and a limiting member that is provided between the image display device and the support portion and limits an angle of light emitted from the image display device to the photosensitive recording medium, the process comprising:
causing the image display device to display a display image for divided exposure, which has a divided gradation value obtained by dividing a gradation value of a recorded image; and
sequentially performing a plurality of exposures of the photosensitive recording medium by the display image for divided exposure to perform a divided exposure for recording the recorded image on the photosensitive recording medium,
wherein a sum of the divided gradation values of the display image for divided exposure used for each exposure in the divided exposure exceeds a maximum gradation number, which is a maximum value of gradations that are able to be displayed on the image display device.

* * * * *